(12) United States Patent
Tanizaki et al.

(10) Patent No.: US 6,400,632 B1
(45) Date of Patent: Jun. 4, 2002

(54) SEMICONDUCTOR DEVICE INCLUDING A FUSE CIRCUIT IN WHICH THE ELECTRIC CURRENT IS CUT OFF AFTER BLOWING SO AS TO PREVENT VOLTAGE FALL

(75) Inventors: Hiroaki Tanizaki; Hideto Hidaka; Tsukasa Ooishi; Shigeki Tomishima; Hiroshi Kato, all of Hyogo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/820,853

(22) Filed: Mar. 30, 2001

(30) Foreign Application Priority Data

Oct. 27, 2000 (JP) .................................... 2000-328533P

(51) Int. Cl.$^7$ ................................................ G11C 7/00
(52) U.S. Cl. ....................... 365/225.7; 365/96; 327/525
(58) Field of Search ............................... 365/96, 225.7, 365/230.06; 257/530; 326/13; 327/525, 526

(56) References Cited

U.S. PATENT DOCUMENTS

| | | | | |
|---|---|---|---|---|
| 4,935,899 A | * | 6/1990 | Morigami | 365/200 |
| 5,345,110 A | * | 9/1994 | Renfro et al. | 327/525 |
| 5,631,862 A | | 5/1997 | Cutter et al. | 365/96 |
| 5,929,691 A | * | 7/1999 | Kim et al. | 327/525 |
| 2001/0030570 A1 | * | 10/2001 | Kim et al. | 327/525 |

OTHER PUBLICATIONS

"A Low–Power Sub 100 ns 256K Bit Dynamic RAM", by Fujii et al., IEEE Journal of Solid–State Circuits, vol. SC–18, No. 5 (Oct. 1983), pp. 441–446.

"WP 24.8: Antifuse EPROM Circuit for Field Programmable DRAM", by Choi et al., 2000 IEEE International Solid–State Circuits Conference.

* cited by examiner

*Primary Examiner*—Son Mai
(74) *Attorney, Agent, or Firm*—McDermot, Will & Emery

(57) ABSTRACT

The antifuse is brought into an electrically conducted state by setting the voltage Vpgm to a high voltage after activating the signal SA and setting the node N1 once to an L-level. By inversion of the latch, the voltage of the node N1 will be the power source voltage Vcc to bring the transistor into a non-conducted state, whereby the electric current flowing through the antifuse is cut off. A semiconductor device can be provided which includes an antifuse program circuit capable of cutting the electric current off after blowing, so as to prevent decrease in the blowing voltage.

16 Claims, 20 Drawing Sheets

FUSE BLOWING OPERATION

READING OPERATION

FUSE BLOWING OPERATION

OPERATION WITHOUT FUSE BLOWING

READING OPERATION 110.0

120.0

FUSE BLOWING OPERATION

OPERATION WITHOUT FUSE BLOWING

READING OPERATION

SEMICONDUCTOR DEVICE INCLUDING A FUSE CIRCUIT IN WHICH THE ELECTRIC CURRENT IS CUT OFF AFTER BLOWING SO AS TO PREVENT VOLTAGE FALL

BACKGROUND OF THE INVENTION

1. Field of the Invention

The present invention relates to a semiconductor device, and more particularly to a semiconductor device including a fuse element that allows information to be stored in a non-volatile manner.

2. Description of the Background Art

For example, a semiconductor memory device having memory cells arranged in an array form in row and column directions include a plurality of extra memory cell rows and memory cell columns. A system for improving the yield of chips on a wafer has been conventionally adopted in which deficient memory cells, memory cell rows, or memory cell columns caused by defects are replaced with the extra memory cell rows or memory cell columns for relief.

This system requires an internal circuit in which poor addresses sensed by a wafer test are stored in advance in a non-volatile manner in the chip, and the row and column addresses input at the time of use are monitored at all times and, when an input of poor addresses is sensed, they are replaced with the extra lines.

As the aforesaid internal circuit, an address sensing circuit is widely used which cuts a polysilicon wiring, an aluminum wiring, or the like with a laser beam, as disclosed, for example, in the document "IEEE Journal of Solid-State Circuits Vol. SC-18No. 5, October 1983, pp. 441–446".

FIG. 32 is a circuit diagram illustrating a construction of a conventional address sensing circuit 500.

Referring to FIG. 32, an address sensing circuit 500 includes fuse elements 502.0 to 502.n each one end of which is connected to a node N500, and N-channel MOS transistors 504.0 to 504.n whose drains are connected respectively to the other ends of the fuse elements 502.0 to 502.n, whose gates receive addresses ADD<0> to ADD<n>, and whose sources are all connected to the ground voltage.

The address sensing circuit 500 further includes P-channel MOS transistors 506, 508 connected in parallel between a node to which the power source voltage Vcc is given and the node N500, and an inverter 510 whose input is connected to the node N500 and which outputs a sensing signal MIS.

A precharging signal PG is given to the gate of the P-channel MOS transistor 506. The gate of the P-channel MOS transistor 508 receives the sensing signal MIS.

An address of positive logic and a complementary address, which is an inverted address thereof, are input via a fuse to a decoder of an extra column of the semiconductor memory device (hereafter referred to as an extra decoder). By cutting off the fuse corresponding to the address of a poor memory cell with a laser beam, the address of the poor memory cell is stored in a non-volatile manner.

On the other hand, the address sensing circuit 500 functions in such a manner that, when the input address coincides with the address corresponding to the poor memory cell stored in a non-volatile manner, a sensing signal MIS for inactivating the normal decoder connected to the poor column is output to replace the poor column with an extra column.

Here, an example has been given for a case in which a column is replaced; however, a similar construction is adopted in the case of replacing a poor row with an extra row.

Further, a fuse element is used also for tuning analog circuits and others whose characteristics change chip by chip. In this case also, the yield can be improved by tuning chip by chip.

The conventional fuse element requires an expensive laser cutter for cutting, and has a problem of poor precision in cutting the fuses. In order to solve these problems, an antifuse element is used in recent years. For example, U.S. Pat. No. 5,631,862 and 2000 IEEE International Solid-State Circuits Conference "WP 24.8 Antifuse EPROM Circuit for Field Programmable DRAM" disclose a circuit example that uses an antifuse element. The circuit disclosed in the latter document will be described hereafter.

FIG. 33 is a circuit diagram illustrating a construction of an antifuse program circuit 520.

Referring to FIG. 33, an antifuse 526 receives a voltage Vpgm at one end thereof and the other end thereof is connected to a node N502. The antifuse 526 in its original state is in a non-conducted state between the two electrodes thereof. When a dielectric substance between the two electrodes is destroyed by allowing the voltage Vpgm to be a high voltage, an electrically conductive type path having a resistance value of about several K Ω is formed between the two electrodes of the antifuse 526.

In a normal operation mode, the voltage Vpgm is maintained at the power source voltage Vcc; however, in changing the antifuse 526 into a conducted state between the two electrodes (hereafter referred to as blowing), a high voltage is applied as the voltage Vpgm.

The signal SA is a signal for selecting whether the antifuse 526 is to be blown or not. In carrying out a reading operation, when the signal SNL is activated after the precharging signal PG is once activated to a L(low)-level to set the voltage of the node N501 to the power source voltage Vcc, it is possible to read whether the antifuse 526 has been blown or not. The read data are latched by the latch circuit constructed with the inverters 544, 546.

FIG. 34 is an operation waveform diagram for describing a fuse blowing operation of the antifuse program circuit 520 shown in FIG. 33.

Referring to FIG. 34, the signal PG is activated to the L-level at the time t1 to initialize the voltage of the node N501.

Subsequently, the signal SA is set at a H(high)-level at the time t2 to fix the voltage of the node N501 at the L-level. Thereafter, the voltage Vpgm is set at a voltage VBP such that the antifuse 526 undergoes dielectric breakdown. Then, the antifuse 526 is blown.

FIG. 35 is an operation waveform diagram for describing an operation in the case where the fuse-blowing is not carried out.

Referring to FIG. 35, the signal PG is activated to the L-level at the time t1 to t2 to initialize the voltage of the node N501.

Next, the signal SA is maintained at the L-level without change at the time t2. This point is different from the case of FIG. 34 in which the signal SA is activated to the H-level to carry out the fuse-blowing.

At the time t2, a high voltage is applied as the voltage Vpgm. However, the node N501 is in a so-called floating state, and its level is at the H-level. Since the power source voltage Vcc is given to the gate of the N-channel MOS transistor 528, the voltage difference Vgs between the gate and the source of the N-channel MOS transistor 528 is 0V, so that the N-channel MOS transistor 528 is in a non-conducted state. Therefore, the node N502 is in a floating state, so that even if a high voltage is applied as the voltage Vpgm, the voltage of the node N502 rises by capacitive coupling to become approximately the same voltage as the voltage Vpgm. For this reason, the voltage applied between the two electrodes of the antifuse 526 is a voltage V5 of FIG. 35 which is approximately near 0V, so that the antifuse 526 is not blown.

As described above, by performing the operations shown in FIGS. 34 and 35 for the antifuse corresponding to each address, the address can be programmed.

Next, the reading operation will be described.

FIG. 36 is an operation waveform diagram for describing a reading operation of the antifuse program circuit 520.

Referring to FIGS. 33 and 36, the voltage Vpgm is set at the power source voltage Vcc as an initial state, and the signal SA is set at the L-level.

Subsequently, at the time t1, the node N501 is initialized by the signal PG.

At the time t2, the signal PG is inactivated to the H-level, and the node N501 is brought to the H-level which is a floating state.

Subsequently, at the time t3, the signal SNL is set at the H-level. Then, if the antifuse 526 has not been blown, the voltage of the node N501 is brought to the L-level by electric conduction of the N-channel MOS transistor 530.

Thereafter, at the time t4, when the signal SNL is brought to the L-level, the voltage of the node N504 is latched by the latch circuit constructed with the inverters 544, 546. By observing a signal F output from the latch circuit, the input address can be compared with the address programmed in the fuse element.

Next, in the case where the fuse has been blown, the voltage of the node N501 is not brought to the L-level even if the signal SNL is brought to the H-level at the time t3 of FIG. 36. Here, the voltage of the node N501 is determined by the ratio of the resistance value of the N-channel MOS transistor 530 in a conducted state, the resistance value of the antifuse 526 after being blown, and the resistance value of the P-channel MOS transistor 528. If the resistance value of the N-channel MOS transistor 530 in a conducted state is set at a sufficiently high level, the voltage of the node N501 can be maintained in a H-level state.

Then, when the signal SNL is brought to the L-level at the time t4, the voltage of the node N501 is brought to the H-level, and is latched by the latch circuit that outputs the signal F. The latch data are used as an input address judging signal in the same manner as in the case where the fuse-blowing has not been carried out.

However, in the conventional antifuse circuit 520, when the antifuse 526 undergoes dielectric breakdown after the time t2 of FIG. 34, the electric current continues to flow, even thereafter, to the ground node via the antifuse 526 and the transistors 528, 530 from the node to which the voltage Vpgm that has become a high voltage is given. It may happen that, by this electric current, the voltage Vpgm falls. In the case where a number of antifuses are to be blown at the same time, decrease in the voltage Vpgm may possibly make it difficult to blow another antifuse after one antifuse is blown.

Furthermore, if there exists an antifuse 526 that has not been completely blown, its resistance value may possibly become larger than the resistance value of the N-channel MOS transistor 530 to pull the voltage of the node N501 to the L-level side thereby to cause erroneous reading operation.

SUMMARY OF THE INVENTION

An object of the present invention is to provide a semiconductor device including an antifuse program circuit in which an antifuse can be cut off with certainty, the address of a poor memory cell can be stably programmed, and a stable reading operation can be realized.

In summary, this invention is a semiconductor device including an antifuse, an electric current limiting circuit, a latch circuit, and an initializing circuit.

One end and the other end of the antifuse are connected respectively to a first node and a second node, and an electrically conductive path is formed between the one end and the other end by application of a voltage exceeding a predetermined value between the one end and the other end. The electric current limiting circuit limits an electric current flowing between the second node and a third node in accordance with a voltage of the third node. The latch circuit is for maintaining the voltage of the third node. The initializing circuit gives an initial voltage to the voltage of the third node.

According to another aspect of the present invention, a semiconductor device includes a plurality of antifuse program circuits, a gate circuit, a first pad, and a second pad.

Each of the antifuse program circuits includes an antifuse whose one end and other end are connected respectively to a first node and a second node, where an electrically conductive path is formed between the one end and the other end by application of a voltage exceeding a predetermined value between the one end and the other end; an electric current limiting circuit that limits an electric current flowing between the second node and a third node in accordance with a voltage of the third node; a latch circuit that maintains the voltage of the third node and outputs an output signal in accordance with the voltage of the third node; and an initializing circuit that gives an initial voltage to the voltage of the third node.

The gate circuit receives outputs of the plurality of antifuse program circuits. From the first pad, a blowing voltage is given to the one end from outside. To the second pad, an output of the gate circuit is given and observed from outside.

According to still another aspect of the present invention, a semiconductor device includes an antifuse.

In the antifuse, an electrically conductive path is formed between one end and other end thereof by application of a voltage exceeding a predetermined value between the one end and the other end. The antifuse includes a well region of first conductivity type that is electrically connected to the one end and formed in a semiconductor substrate; first and second impurity regions that are electrically connected to the one end and formed in an inside of the well region; an insulator film formed above a region between the first impurity region and the second impurity region; and an electrically conductive electrode layer that is electrically connected to the other end and formed above the insulator film.

Therefore, a principal advantage of the present invention lies in that, since the electric current does not flow when the antifuse is blown, the blowing voltage can be prevented from falling, thereby improving the reliability of the blowing operation.

Another advantage of the present invention lies in that, since the completion of blowing can be observed from outside, the antifuse can be blown with certainty.

Still another advantage of the present invention lies in that, since a MOS structure is used as an antifuse, the dielectric breakdown of the antifuse is facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
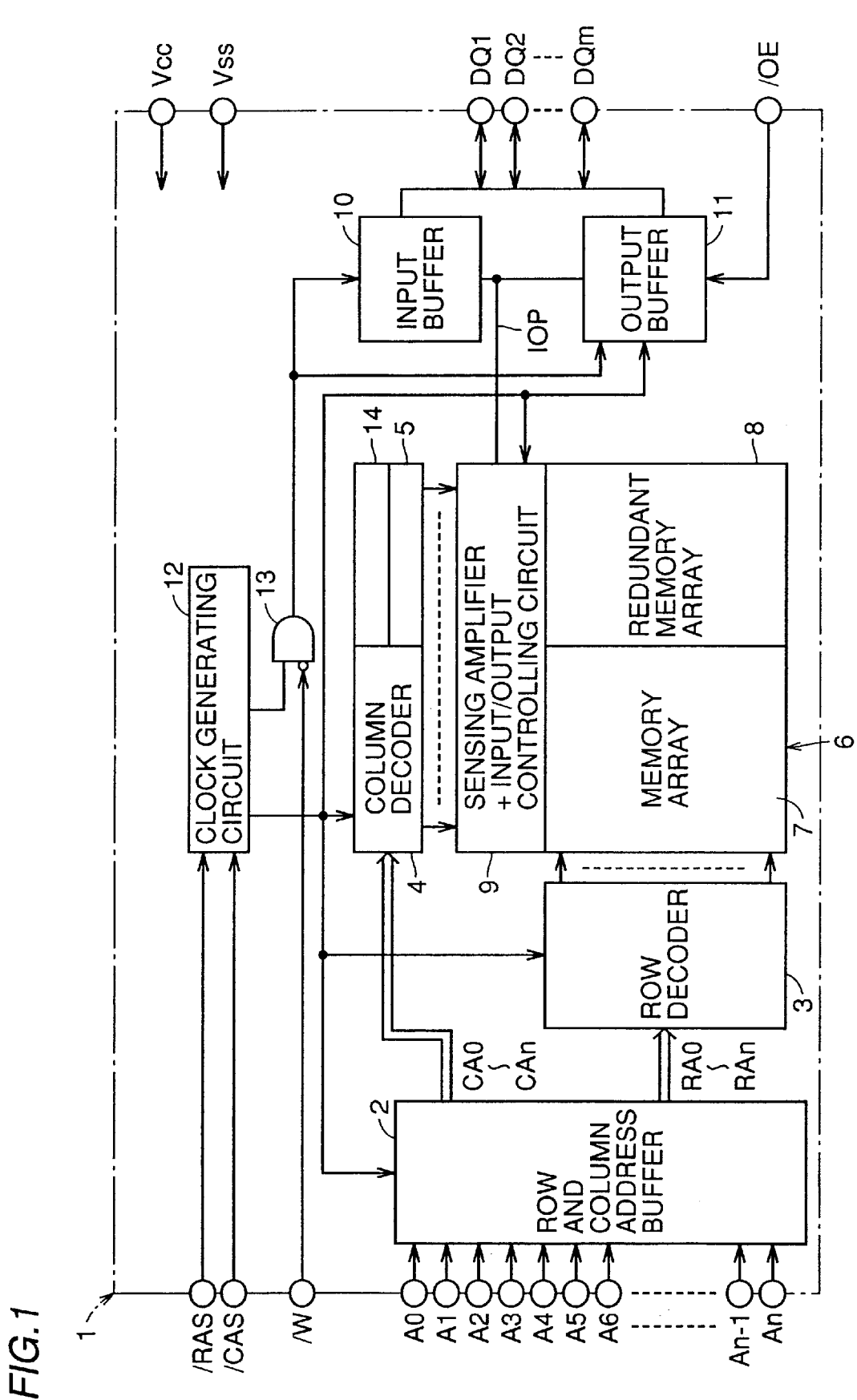
FIG. 1 is a block diagram illustrating a construction of a semiconductor device 1 according to a first embodiment.

Hereafter, preferred embodiments of the present invention will be described in detail with reference to the attached drawings. Here, in the drawings, like or corresponding parts are denoted with like reference numerals.

FIG. 1 is a block diagram illustrating a construction of a semiconductor device according to the first embodiment of the present invention.

First Embodiment

Referring to FIG. 1, the semiconductor device 1 includes a clock generating circuit 12 that selects a predetermined operation mode on the basis of signals /RAS, /CAS given from the outside and generates a clock signal that controls the entire semiconductor device 1; a row and column address buffer 2 that generates row address signals RA0 to RAn and column address signals CA0 to CAn on the basis of the address signals A0 to An (n: integer equal to or larger than 1) given from the outside; a row decoder 3 that performs a decoding operation in response to the row address signals RA0 to RAn; and a column decoder 4 that performs a decoding operation in response to the column address signals CA0 to CAn.

The semiconductor device 1 further includes a gate circuit 13 that outputs a control signal in accordance with a signal /W given from the outside and the output of the clock generating circuit 12; an input buffer 10 that receives input data from data terminals DQ1 to DQm (m: positive integer) in accordance with the output signal of the gate circuit 13 and transmits the input data to a data bus IOP; an output buffer 11 that outputs the data of the data bus IOP to the data terminals DQ1 to DQm in accordance with the output signal of the gate circuit 13 and a signal /OE given from the outside; and a memory mat 6 whose rows and columns are designated by the column decoder 4 and the row decoder 3 and which gives and receives data to and from the data bus IOP.

The memory mat 6 includes a memory array 7 including a plurality of memory cells which are arranged in a matrix form and each of which stores data of one bit, and a sensing amplifier+input/output control circuit 9 that connects the memory cell of the address designated by the row decoder 3 and the column decoder 4 to one end of the data bus IOP.

The memory array 7 includes a redundant memory array having a redundant memory cell for replacing a poor memory cell when the poor memory cell is found out. In accordance therewith, the column decoder 4 includes a redundant column decoder 5 for designating a redundant memory array.

The semiconductor device 1 further includes an address sensing circuit 14 whose stand-by state is released in accordance with the signal /RAS and which receives the address signal predecoded by the column decoder and, when the input address coincides with the address of the poor memory cell set in the inside thereof, activates the redundant column decoder and inactivates the output of the column decoder.

In this address sensing circuit 14, a circuit including a fuse is used for setting the address of the poor memory cell.

Here, in FIG. 1, the construction of a dynamic random access memory (DRAM has been described as an example of the semiconductor device; however, the present invention can be likewise used in other semiconductor devices besides the DRAM as long as they are semiconductor devices that require an internal state setting such as redundancy substitution.

Further, the semiconductor device is not limited to semiconductor memory devices, so that the present invention can be applied to analog circuits such as A/D converters that are tuned by a fuse element, other semiconductor devices, and the like.

Figure 2:
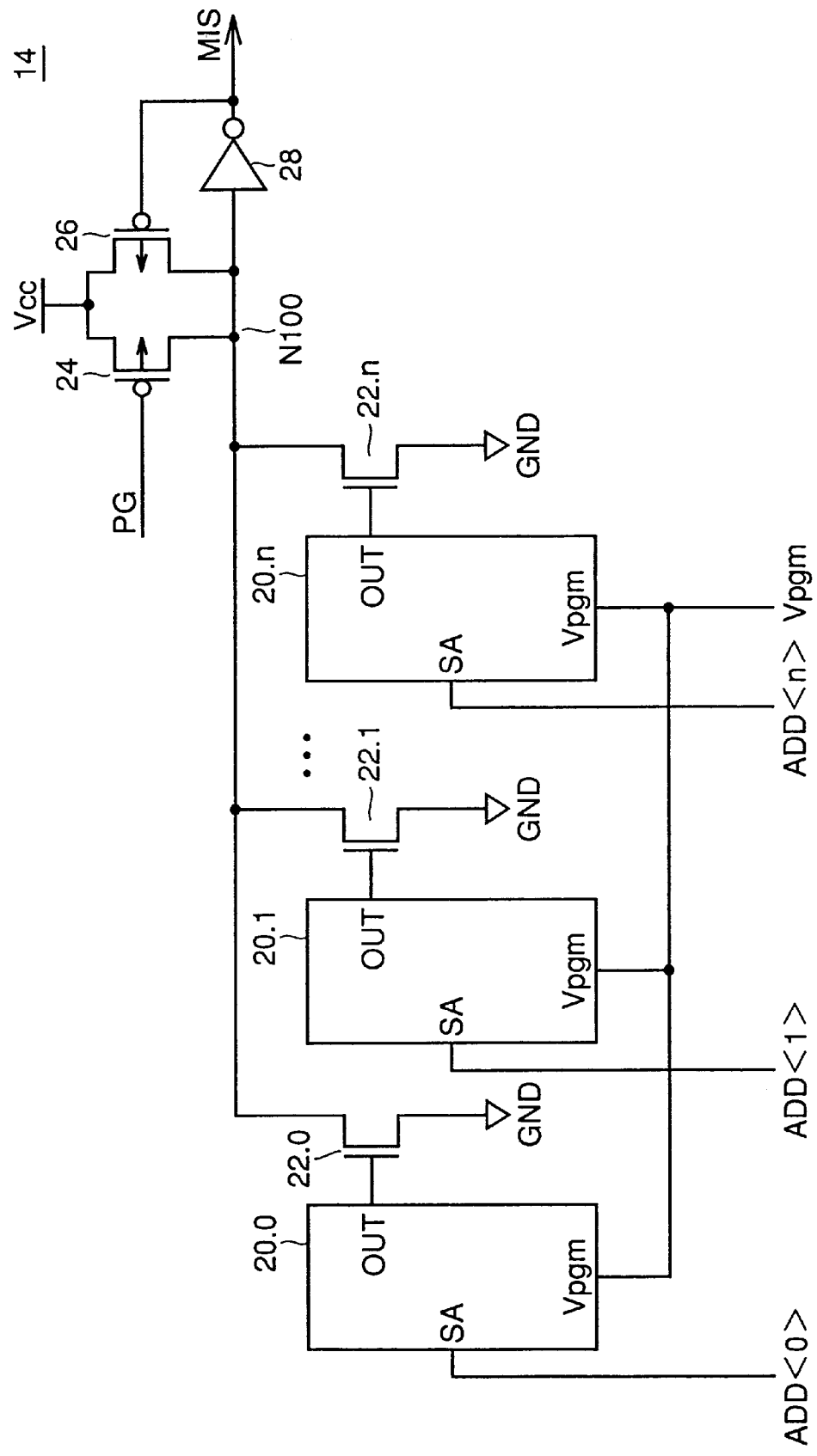
FIG. 2 is a circuit diagram illustrating a construction of an address sensing circuit 14 in FIG. 1.

FIG. 2 is a circuit diagram illustrating a construction of the address sensing circuit 14 in FIG. 1. Referring to FIG. 2, the address sensing circuit 14 includes antifuse program circuits 20.0 to 20.n respectively receiving the address signals ADD<0> to ADD<n>, and N-channel MOS transistors 22.0 to 22.n whose gates respectively receive the outputs of the antifuse program circuits 20.0 to 20.n.

A voltage Vpgm used for fuse blowing is given commonly to the antifuse program circuits 20.0 to 20.n. The N-channel MOS transistors 22.0 to 22.n are connected in parallel between a node N100 and a ground node. As the input signal SA of each antifuse program circuit, a corresponding address signal ADD is given.

The address sensing circuit 14 further includes P-channel MOS transistors 24, 26 that are connected in parallel between the node to which the power source voltage Vcc is given and the node N100, and an inverter 28 that receives the voltage of the node N100 to output a sensing signal MIS. The P-channel MOS transistor 24 sets the voltage of the node N100 to a H-level when the gate thereof is activated by receiving a precharging signal PG. If any one of the antifuses contained in the antifuse program circuits 20.0 to 20.n has been blown, one of the N-channel MOS transistors 22.0 to 22.n is electrically conducted in accordance with the input of the address signals ADD<0>to ADD<n>to lower the voltage of the node N100 to a L-level, whereby the sensing signal MIS is brought to the H-level. The P-channel MOS transistor 26 is disposed so as to prevent the voltage of the node N100 from falling to the L-level in the case where none of the N-channel MOS transistors 22.0 to 22.n is electrically conducted, and the signal MIS is given to the gate of the P-channel MOS transistor 26.

Figure 3:
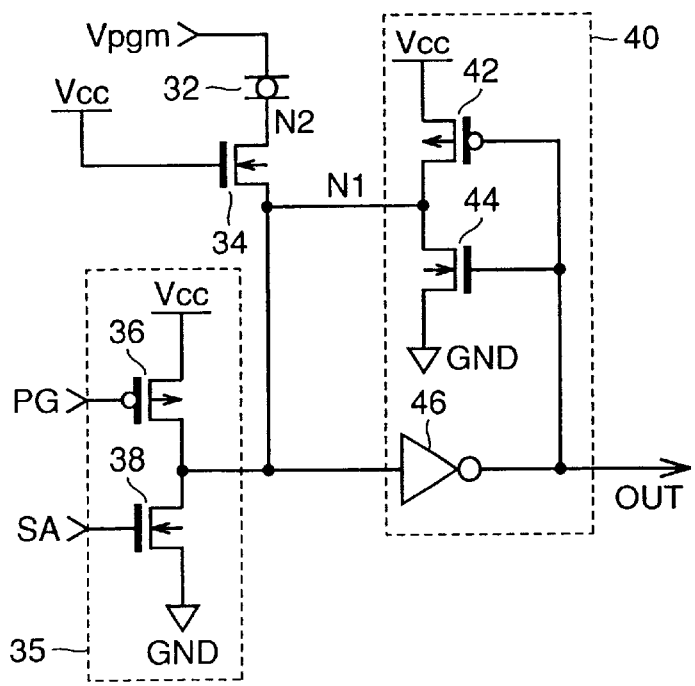
FIG. 3 is a circuit diagram illustrating a construction of an antifuse program circuit 20.0 in FIG. 2.

FIG. 3 is a circuit diagram illustrating a construction of the antifuse program circuit 20.0 in FIG. 2.

Here, since the antifuse program circuits 20.1 to 20.n of FIG. 2 have similar constructions, the description thereof will not be repeated.

Referring to FIG. 3, the antifuse program circuit 20.0 includes an antifuse 32 which is connected between the node to which the voltage Vpgm is given and the node N2; an N-channel MOS transistor 34 which is connected between the node N2 and the node N1 and whose gate receives the power source voltage Vcc; an initializing circuit 35 which sets the voltage of the node N1 to a predetermined value; and a latch circuit 40 which latches the voltage of the node N1 to output a signal OUT.

The initializing circuit 35 includes a P-channel MOS transistor 36 which is connected between the node to which the power source voltage Vcc is given and the node N1 and whose gate receives the signal PG, and an N-channel MOS transistor 38 which is connected between the node N1 and the ground node and whose gate receives the signal SA.

The latch circuit 40 includes an inverter 46 whose input is connected to the node N1 and which outputs the signal OUT, a P-channel MOS transistor 42 which is connected between the node to which the power source voltage Vcc is given and the node N1 and whose gate receives the signal OUT, and an N-channel MOS transistor 44 which is connected between the node N1 and the ground node and whose gate receives the signal OUT.

Figure 4:
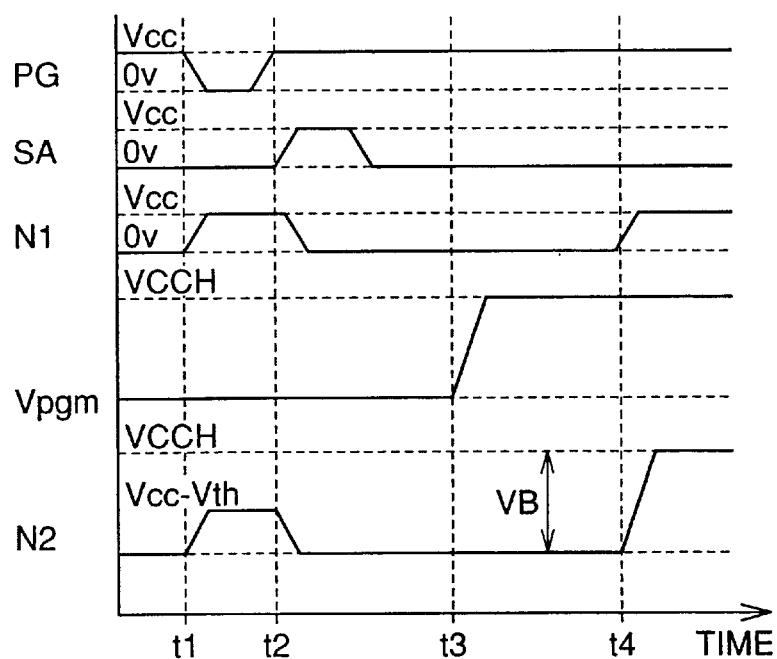
FIG. 4 is an operation waveform diagram for describing a fuse blowing operation of the antifuse program circuit 20.0.

FIG. 4 is an operation waveform diagram for describing a fuse blowing operation of the antifuse program circuit 20.0.

Referring to FIGS. 3 and 4, the signal PG is activated to the L-level at the time t1. In accordance therewith, the P-channel MOS transistor 36 is brought to a conducted state, the latch circuit 40 is initialized, and the node N1 is brought to the H-level.

Subsequently, the signal PG is inactivated to the H-level at the time t2, and thereafter the signal SA is activated to the H-level. In accordance therewith, the node N1 is set at the L-level, and the latch circuit 40 maintains this value. When the latch circuit 40 maintains the voltage of the node N1, the signal SA is inactivated to the L-level.

Subsequently, the voltage Vpgm is set at a high voltage VCCH at the time t3. Then, since the node N1 is at the L-level, the N-channel MOS transistor 34 is brought to the conducted state, and the voltage of the node N2 is also brought to the L-level. Therefore, a voltage difference VB, which is a dielectric breakdown voltage, is applied between the two electrodes of the antifuse 32. Then, the antifuse to which the high voltage is applied between the two electrodes undergoes dielectric breakdown because a voltage higher than the breakdown voltage is applied between the two electrodes, whereby an electrically conductive path is formed between the two electrodes.

When the electrically conductive path is formed between the two electrodes of the antifuse 32 at the time t4, the voltage of the node N1 gradually rises and, when the voltage exceeds the threshold voltage of the inverter 46, the maintained value of the latch circuit 40 is inverted.

When the maintained value of the latch circuit 40 is inverted and the voltage of the node N1 is brought to the H-level, the gate voltage of the N-channel MOS transistor 34 will be equal to the voltage of the node N1, whereby the voltage difference between the gate and the source of the N-channel MOS transistor 34 will be 0V. Therefore, the N-channel MOS transistor 34 changes from the conducted state to the non-conducted state by inversion of the maintained value of the latch circuit 40.

Since the N-channel MOS transistor 34 changes to the non-conducted state, the electric current, which was flowing towards the ground node from the node to which the voltage Vpgm is given, no longer flows in the electrically conductive path of the antifuse 32 after the antifuse 32 is blown.

At this time, in order that the maintained value of the latch circuit 40 is inverted, the sum of the resistance value of the antifuse 32 after electrical conduction and the resistance value of the N-channel MOS transistor 34 at the time of electrical conduction must be smaller than the resistance value of the N-channel MOS transistor 44 at the time of electrical conduction.

Further, by continuing the fuse blowing operation until the inversion of the output of the latch circuit 40 is confirmed, management of the resistance of the antifuse can be carried out at the fuse blowing time, whereby occurrence of an erroneous operation at the reading time caused by incomplete blowing of the antifuse 32 can be prevented.

Therefore, the quality of blowing the antifuse can be improved.

Figure 5:
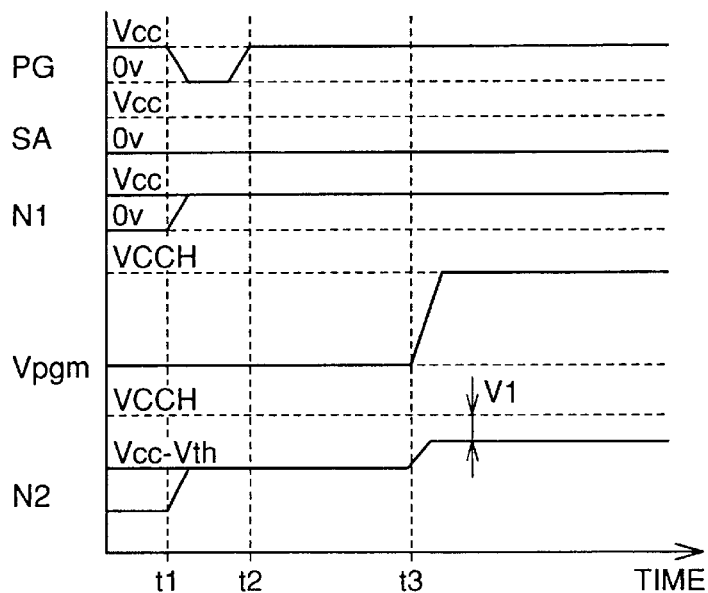
FIG. 5 is an operation waveform diagram for describing an operation in the case where the antifuse 32 of FIG. 3 is not blown.

FIG. 5 is an operation waveform diagram for describing an operation in the case where the antifuse 32 of FIG. 3 is not blown.

Referring to FIGS. 3 and 5, the signal PG is set at the L-level to initialize the latch circuit 40 at the time t1.

Subsequently, the signal PG is inactivated to the H-level at the time t2. This allows the voltage of the node N1 to be maintained at the H-level.

Subsequently, the voltage Vpgm is set at the high voltage VCCH at the time t3.

However, since the voltage of the node N1 is at the H-level, the voltage difference Vgs between the gate and the source of the N-channel MOS transistor 34 whose gate is connected to the power source voltage Vcc is 0V. Therefore, the N-channel MOS transistor 34 is brought to the non-conducted state, and the voltage of the node N2 rises near to the high voltage VCCH by capacitive coupling simultaneously when the voltage Vpgm is set at the high voltage VCCH. In other words, the voltage difference between the two electrodes of the antifuse 32 becomes approximately 0V, so that the antifuse does not undergo dielectric breakdown.

Figure 6:
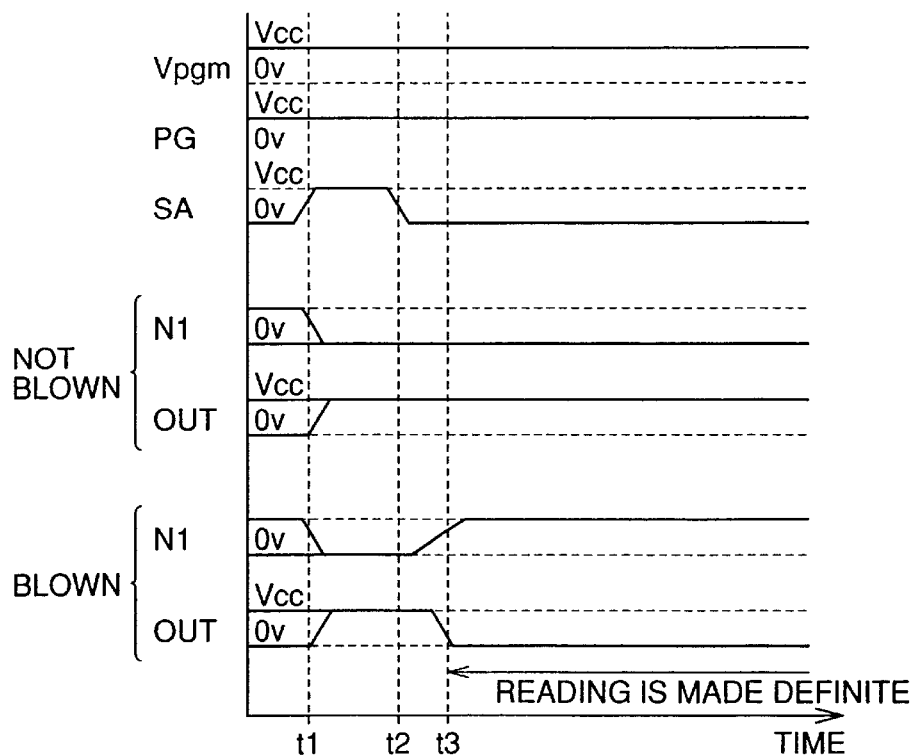
FIG. 6 is an operation waveform diagram for describing a reading operation of the antifuse program circuit 20.0.

FIG. 6 is an operation waveform diagram for describing a reading operation of the antifuse program circuit 20.0.

Referring to FIGS. 3 and 6, first in an initial state of the reading operation, the voltage Vpgm is set equal to the power source voltage Vcc, and the signal PG is set at the H-level.

Subsequently, when the signal SA is set at the H-level during the time t1 to t2, the latch circuit 40 is initialized. At this time, the voltage of the node N1 is at the L-level.

When the signal SA is set at the L-level at the time t2, the voltage of the node N1 is maintained at the L-level if the antifuse 32 has not been blown.

On the other hand, if the antifuse 32 has been blown, the N-channel MOS transistor 34 is brought to the conducted state because the gate thereof is at the H-level and the source thereof is at the L-level, whereby a charging current flows to the node N1 via the antifuse 32 in a conducted state and the N-channel MOS transistor 34. When the voltage of the node N1 rises and exceeds the threshold voltage of the inverter 46, the maintained value of the latch circuit 40 is inverted and the voltage of the node N1 is maintained at the H-level. When the voltage of the node N1 is brought to the H-level, the voltage difference Vgs between the gate and the source of the N-channel MOS transistor 34 becomes 0V, whereby the N-channel MOS transistor 34 is brought to the non-conducted state.

As described above, by observing the output signal OUT after the signal SA is once activated to the H-level and then inactivated, it is possible to observe whether the antifuse 32 has been blown or not. By the output of the latch circuit, the address judgement of a defective memory cell in a semiconductor memory device, circuit tuning of an analog circuit, and others can be programmed.

With the use of the antifuse program circuit 20.0 shown in FIG. 3, the electric current does not flow through the antifuse after fuse-blowing, so that the voltage Vpgm does not fall. For this reason, erroneous operations can be prevented, and the quality of the fuse-blowing can be improved.

Second Embodiment

Figure 7:
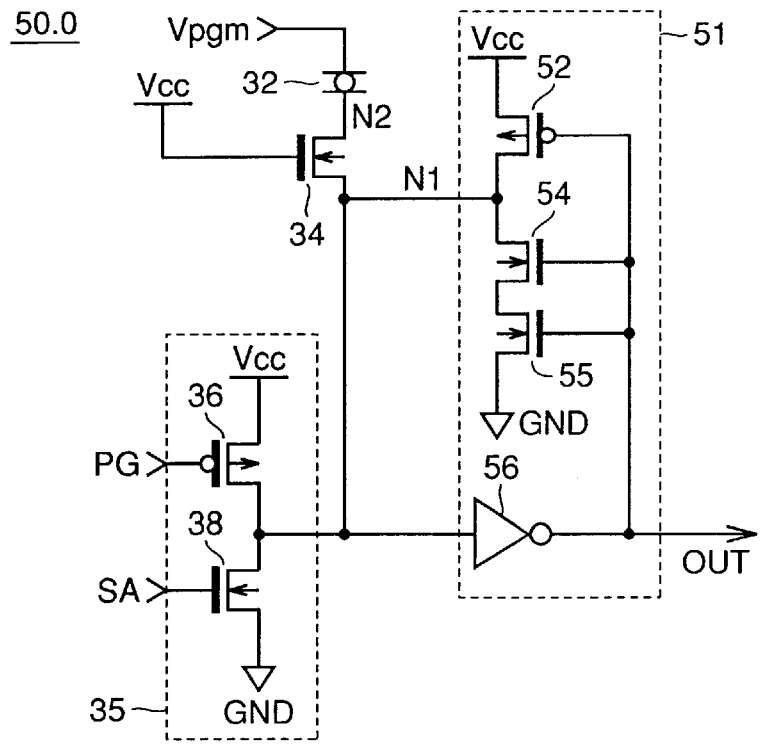
FIG. 7 is a circuit diagram illustrating a construction of an antifuse program circuit 50.0 used in a second embodiment.

FIG. 7 is a circuit diagram illustrating an antifuse program circuit 50.0 used in the second embodiment of the present invention.

Referring to FIG. 7, the antifuse program circuit 50.0 is different in construction from the antifuse program circuit 20.0 in that it includes a latch circuit 51 instead of the latch circuit 40 in the construction of the antifuse program circuit 20.0 shown in FIG. 3.

The latch circuit 51 includes an inverter 56 whose input is connected to the node N1 and which outputs an output signal OUT, a P-channel MOS transistor 52 whose gate receives the output signal OUT and which is connected between the node to which the power source voltage Vcc is given and the node N1, and N-channel MOS transistors 54, 55 which are connected in series between the node N1 and the ground node and whose gates both receive the output signal OUT.

The difference between the latch circuit 40 shown in FIG. 3 and the latch circuit 51 lies in that an N-channel MOS transistor is further inserted in series between the source of the N-channel MOS transistor 44 of FIG. 3 and the ground node to increase the resistance value between the node N1 and the ground node, so as to facilitate inversion of the latch circuit even if the resistance value of the antifuse 32 is large after blowing. By adopting such a construction, the maintained value of the latch circuit 51 is easily inverted even in the case where the resistance value of the antifuse after blowing is set high, thereby preventing decrease in the voltage Vpgm in the same manner as in the first embodiment.

Third Embodiment

Figure 8:
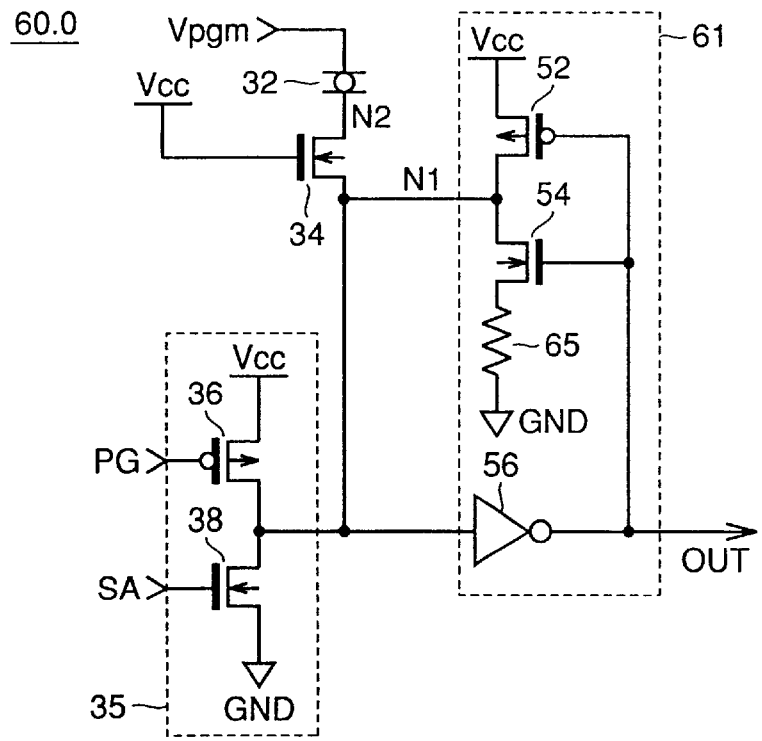
FIG. 8 is a circuit diagram illustrating a construction of an antifuse program circuit 60.0 used in a third embodiment.

FIG. 8 is a circuit diagram illustrating an antifuse program circuit 60.0 used in the third embodiment of the present invention.

Referring to FIG. 8, the antifuse program circuit 60.0 includes a latch circuit 61 instead of the latch circuit 51 in the construction of the antifuse program circuit 50.0 shown in FIG. 7.

The latch circuit 61 includes a resistor element 65 connected between the source of the N-channel MOS transistor 54 and the ground node instead of the N-channel MOS transistor 55 in the construction of the latch circuit 51 in FIG. 7. On this point, the latch circuit 61 is different from the latch circuit 51.

Except for the aforesaid difference, the construction of the antifuse program circuit 60.0 is the same as that of the antifuse program circuit 50.0 shown in FIG. 7, so that the description thereof will not be repeated.

As shown in FIG. 8, by inserting a resistor 65, the latch inversion is facilitated even if the resistance value of the antifuse 32 after blowing is set high, so that the electric current can be prevented from flowing through the antifuse after fuse-blowing, thereby preventing decrease in the voltage Vpgm.

Fourth Embodiment

In the first embodiment, the voltage difference Vgs between the gate and the source of the N-channel MOS transistor 34 of FIG. 3 increases when the antifuse is blown. For example, when the fuse is blown at the time t4 in FIG. 4, the voltage of the node N2 rises up to the high voltage VCCH. At this time, the voltage difference VCCH-Vcc is applied between the node N2 and the gate of the N-channel MOS transistor 34. In this case, if the high voltage VCCH, which is the blowing voltage, is increased, the voltage difference between the gate and the source of the N-channel MOS transistor 34 increases all the more. Therefore, it has not been possible to increase the high voltage VCCH so much at the blowing time.

Figure 9:
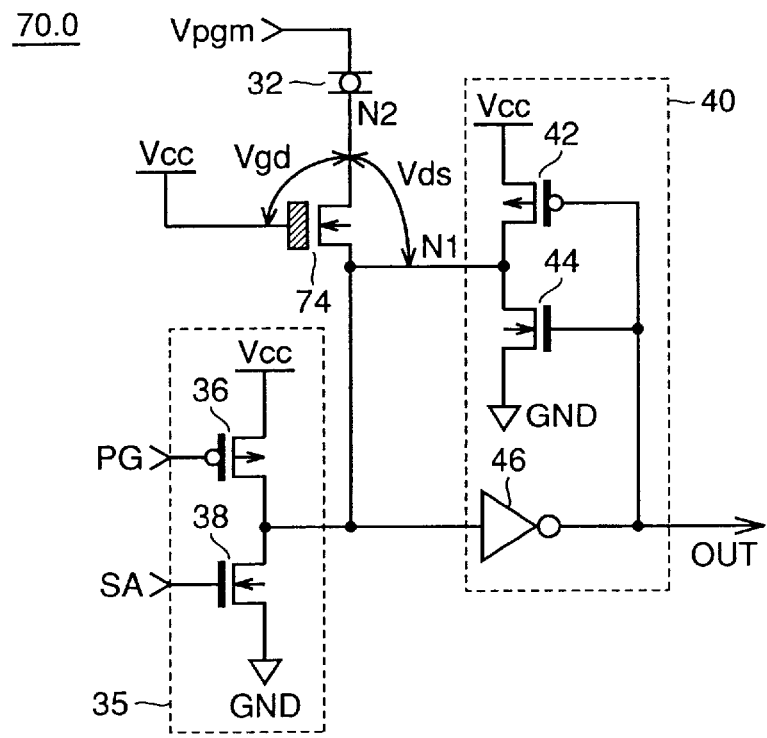
FIG. 9 is a circuit diagram illustrating a construction of an antifuse program circuit 70.0 used in a fourth embodiment.

FIG. 9 is a circuit diagram illustrating an antifuse program circuit 70.0 used in the fourth embodiment of the present invention.

Referring to FIG. 9, the antifuse program circuit 70.0 is different in construction from the antifuse program circuit 20.0 in that it includes an N-channel MOS transistor 74 having a larger gate dielectric strength instead of the N-channel MOS transistor 34 in the construction of the antifuse program circuit 20.0 shown in FIG. 3. Except for the aforesaid difference, the construction of the antifuse program circuit 70.0 is the same as that of the antifuse program circuit 20.0, so that the description thereof will not be repeated.

By adopting a construction using an N-channel MOS transistor 74 having a larger gate dielectric strength, the voltage VCCH can be increased. Increase in the voltage VCCH facilitates dielectric breakdown of the antifuse. Further, in FIG. 5, although a high voltage of a similar degree is applied to the N-channel MOS transistor 34 also at the time t3, the N-channel MOS transistor 74 is not destroyed because of high dielectric strength.

For example, as a method for increasing the gate dielectric strength, there is a method of increasing the film thickness Tox of the gate oxide film so that the transistor will not undergo dielectric breakdown easily even if the voltage difference Vgs between the gate and the source of the transistor increases.

As described above, in the third embodiment, the voltage for blowing the fuse can be increased by using a transistor having a high dielectric strength for a transistor that may possibly be destroyed when the high voltage VCCH applied at the blowing time is increased. Therefore, the destruction of the insulator film of the fuse can be carried out easily.

Fifth Embodiment

In the fifth embodiment, a construction for improving the reliability of the antifuse program circuit at the reading time will be described.

Figure 10:
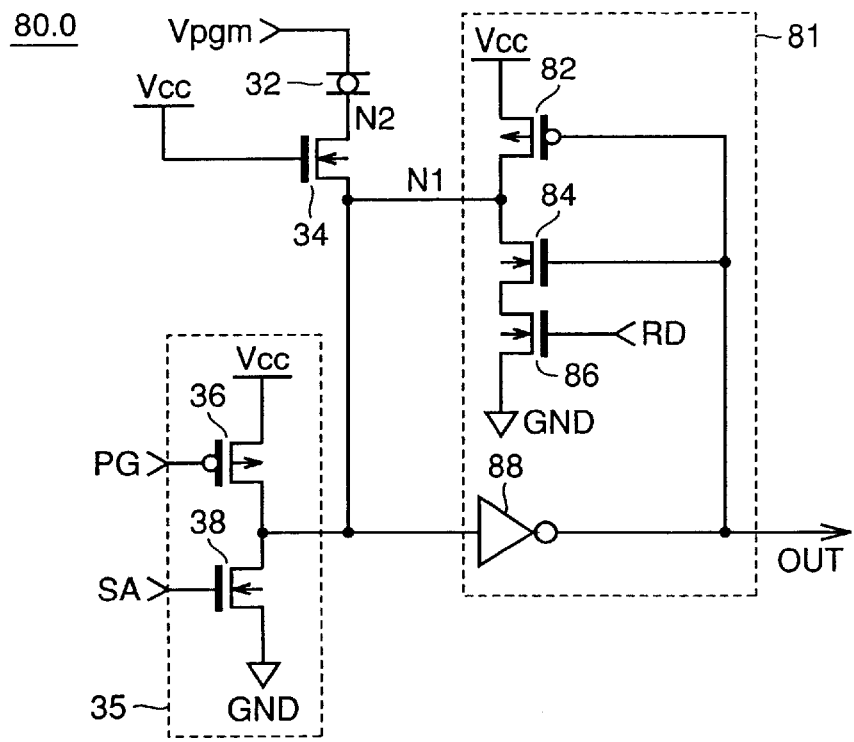
FIG. 10 is a circuit diagram illustrating a construction of an antifuse program circuit 80.0 used in a fifth embodiment.

FIG. 10 is a circuit diagram illustrating an antifuse program circuit 80.0 used in the fifth embodiment of the present invention.

Referring to FIG. 10, the antifuse program circuit 80.0 includes a latch circuit 81 instead of the latch circuit 40 in the construction of the antifuse program circuit 20.0 shown in FIG. 3. The latch circuit 81 includes an inverter 88 whose input is connected to the node N1 and which outputs an output signal OUT, a P-channel MOS transistor 82 whose gate receives the output signal OUT and which is connected between the node to which the power source voltage Vcc is given and the node N1, and N-channel MOS transistors 84, 86 which are connected in series between the node N1 and the ground node. The gate of the N-channel MOS transistor 84 receives the signal OUT. The gate of the N-channel MOS transistor 86 receives a signal RD that is activated to the H-level at the reading time.

Except for the aforesaid difference, the construction of the antifuse program circuit 80.0 is the same as that of the antifuse program circuit 20.0 shown in FIG. 3, so that the description thereof will not be repeated.

Figure 11:
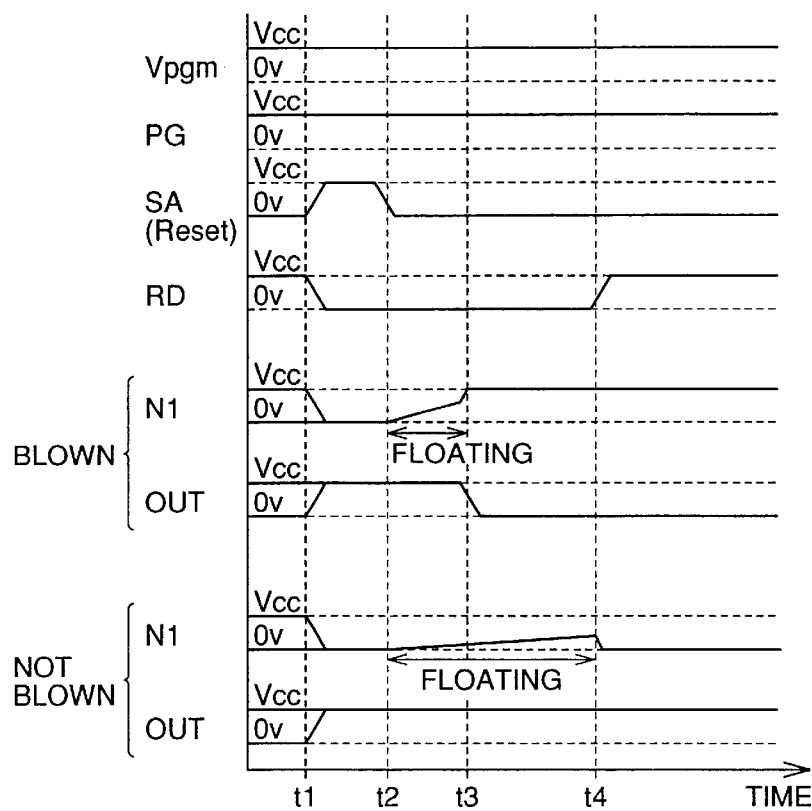
FIG. 11 is an operation waveform diagram for describing a reading operation of the antifuse program circuit 80.0 shown in FIG. 10.

FIG. 11 is an operation waveform diagram for describing a reading operation of the antifuse program circuit 80.0 shown in FIG. 10.

Referring to FIGS. 10 and 11, first in an initial state of the reading operation, the voltage Vpgm is set equal to the power source voltage Vcc, and the signal PG is set at the H-level.

At the time t1 to t2, the signal SA is set at the H-level. Simultaneously, at the time t1, the signal RD is set at the L-level. When the signal RD is set at the L-level, the node N1 will not be connected to the ground node even if the N-channel MOS transistor 84 is brought to a conducted state.

When the signal SA is brought to the L-level at the time t2, the node N1 is brought to a floating state. At this time, if the antifuse 32 has been blown, the electric current is supplied via the antifuse 32 and the N-channel MOS transistor 34, so that the node N1 is charged to the H-level. When the voltage of the node N1 is charged to some extent near to the H-level, the voltage exceeds the logical threshold voltage of the inverter 88, so that the output signal OUT goes to the L-level at the time t3 to bring the P-channel MOS transistor 82 into a conducted state, whereby the voltage of the node N1 is latched.

At the time t4, the signal RD is brought to the H-level to provide a completely latched state.

On the other hand, if the fuse has not been blown, the voltage of the node N1 is at the L-level at the time t1.

Subsequently, at the time t2, the signal SA is set at the L-level, so that the node N1 is brought to a floating state.

However, if the antifuse 32 has not been blown, the node N1 is maintained at the floating state.

When the signal RD is set at the H-level at the time t4, the N-channel MOS transistors 84, 86 are brought to the conducted state, and the level of the node N1 is maintained at the L-level.

As described above, in reading out whether the antifuse 32 has been blown or not, the reading operation is carried out while the node N1 is maintained in the floating state by inactivating a part of the feedback part of the latch circuit. Therefore, even in the case where the resistance value after blowing is set at a large value or in the case where the resistance value of the antifuse after blowing increases with lapse of time, the signal OUT can be accurately output.

Here, in carrying out the blowing operation, the signal RD is set at the H-level, and the blowing operation is carried out by a method similar to the one described in the first embodiment.

Sixth Embodiment

The fifth embodiment aims at improving the reliability of the reading operation of the antifuse program circuit. The sixth embodiment likewise aims at improving the reliability of the reading operation.

Figure 12:
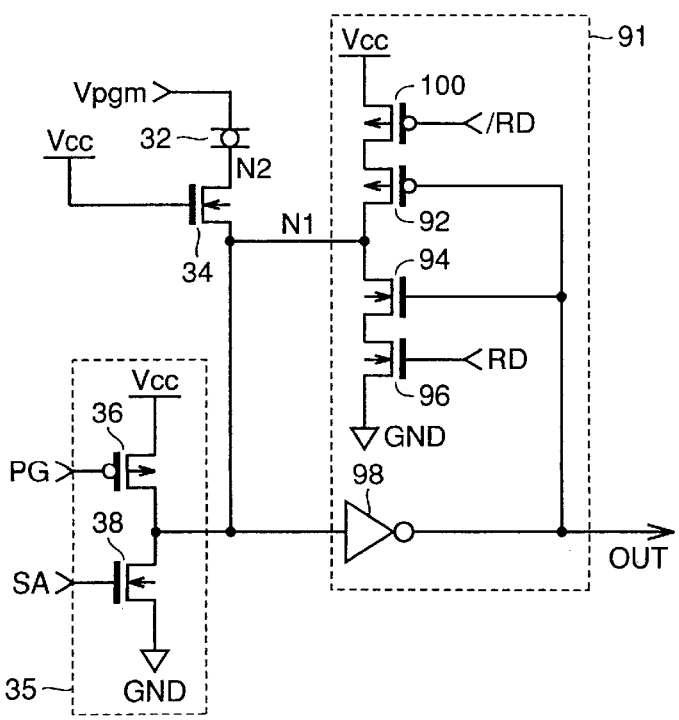
FIG. 12 is a circuit diagram illustrating a construction of an antifuse program circuit 90.0 used in a sixth embodiment.

FIG. 12 is a circuit diagram illustrating an antifuse program circuit 90.0 used in the sixth embodiment of the present invention.

Referring to FIG. 12, the antifuse program circuit 90.0 includes a latch circuit 91 instead of the latch circuit 40 in the construction of the antifuse program circuit 20.0 shown in FIG. 3.

The latch circuit 91 includes an inverter 98 whose input is connected to the node N1 and which outputs an output signal OUT, P-channel MOS transistors 100, 92 which are connected in series between the node to which the power source voltage Vcc is given and the node N1, and N-channel MOS transistors 94, 96 which are connected in series between the node N1 and the ground node.

The gates of the P-channel MOS transistor 92 and the N-channel MOS transistor 94 both receive the signal OUT. The gate of the N-channel MOS transistor 96 receives a signal RD. The gate of the P-channel MOS transistor 100 receives a signal /RD which is complementary to the signal RD.

In the reading operation, first the signal SA is activated to set the node N1 at the L-level. Simultaneously, the N-channel MOS transistor 96 and the P-channel MOS transistor 100 are both brought to the non-conducted state by the signals RD, /RD to bring the node N1 to a floating state.

When the node N1 is set at the floating state, the node N1 is brought to the H-level if the antifuse 32 has been blown, whereas the node N1 is maintained at the L-level if the antifuse 32 has not been blown.

When the voltage of the node N1 is made definite, the reading operation is completed by activating the signal RD to the H-level to latch the voltage of the node N1 by the latch circuit 91. The output signal OUT corresponding to the read data is used as data for redundancy judgement or for circuit tuning.

As described above, in the sixth embodiment, by bringing the node N1 to the floating state at the reading time, the state of the antifuse can be accurately read out even in the case where the resistance value after electric conduction of the antifuse is set at a large value or in the case where the resistance after electric conduction of the antifuse increases with lapse of time.

Seventh Embodiment

In the first embodiment, the antifuse is blown by application of a positive voltage to the antifuse. The seventh embodiment shows a circuit construction for blowing an antifuse by application of a negative voltage to the antifuse.

Figure 13:
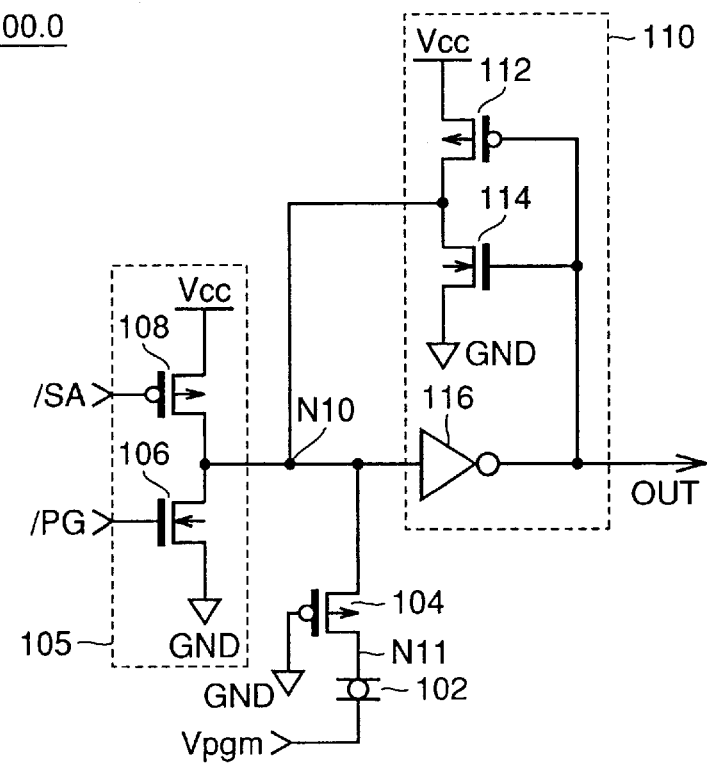
FIG. 13 is a circuit diagram illustrating a construction of an antifuse program circuit 100.0 used in a seventh embodiment.

FIG. 13 is a circuit diagram illustrating an antifuse program circuit 100.0 used in the seventh embodiment of the present invention.

Referring to FIG. 13, the antifuse program circuit 100.0 includes an initializing circuit 105 which sets the voltage of a node N10, an antifuse 102 which is connected between the node to which the voltage Vpgm is given and a node N11, a P-channel MOS transistor 104 which is connected between the node N11 and the node N10 and whose gate is connected to the ground node, and a latch circuit 110 which latches the voltage of the node N10 and which outputs an output signal OUT.

The initializing circuit 105 includes a P-channel MOS transistor 108 which is connected between the node to which the power source voltage Vcc is given and the node N10 and whose gate receives a signal /SA, and an N-channel MOS transistor 106 which is connected between the node N10 and the ground node and whose gate receives a signal /PG.

The latch circuit 110 includes an inverter 116 whose input is connected to the node N 10 and which outputs the output signal OUT, a P-channel MOS transistor 112 which is connected between the node to which the power source voltage Vcc is given and the node N10 and whose gate receives the output signal OUT, and an N-channel MOS transistor 114 which is connected between the node N10 and the ground node and whose gate receives the output signal OUT.

Figure 14:
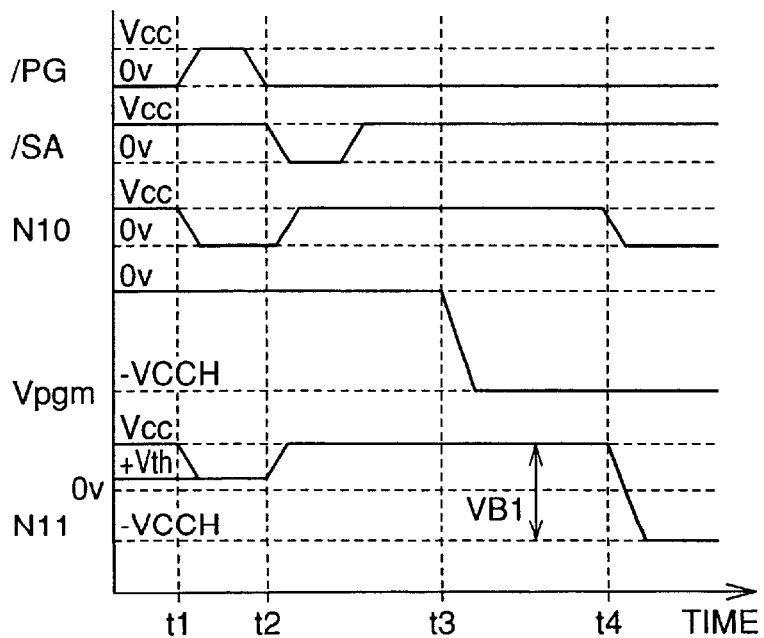
FIG. 14 is an operation waveform diagram for describing a fuse blowing operation.

FIG. 14 is an operation waveform diagram for describing a fuse-blowing operation.

Referring to FIGS. 13 and 14, the signal /PG is set at the H-level at the time t1 to t2. In accordance therewith, the node N10 which is an input node of the latch circuit is set at the L-level.

Subsequently, at the time t2, the signal /SA is set at the L-level to change the node N10 to the H-level, and this value is latched by the latch circuit 110.

Subsequently, at the time t3, the voltage Vpgm is set at a negative high voltage of −VCCH. Then, a voltage difference Vcc+VCCH is given between the two electrodes of the antifuse 102, whereby the antifuse 102 undergoes dielectric breakdown to form an electrically conductive path.

When the electrically conductive path is formed in the antifuse, the node N10 is brought to the L-level, and the voltage difference Vgs between the gate and the source of the P-channel MOS transistor 104 becomes 0V, whereby the P-channel MOS transistor 104 is brought to a non-conducted state. Therefore, after the antifuse 102 is blown, the electric current no longer flows through the antifuse 102 because the P-channel MOS transistor 104 is brought to a non-conducted state.

Figure 15:
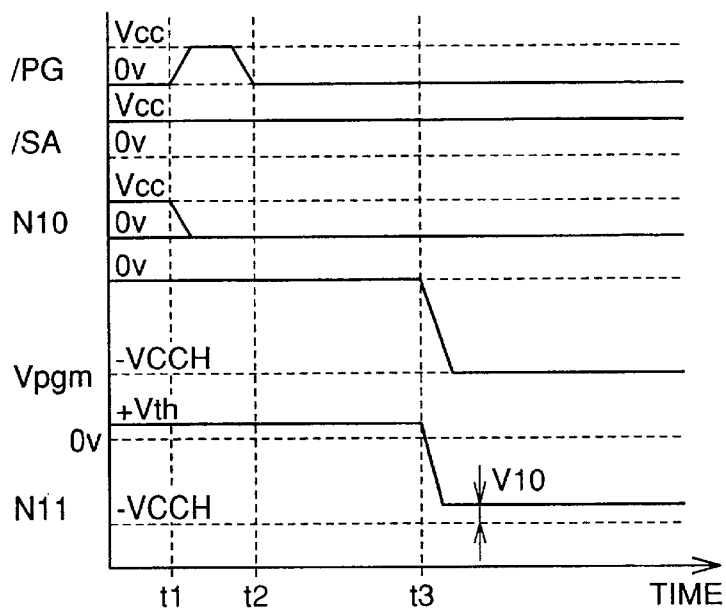
FIG. 15 is an operation waveform diagram for describing an operation in the case where the fuse-blowing is not carried out.

FIG. 15 is an operation waveform diagram for describing the case in which the fuse-blowing is not carried out.

Referring to FIGS. 13 and 15, the signal /PG is set at the H-level at the time t1 to t2. In accordance therewith, the input node N10 of the latch circuit is fixed to the L-level.

Next, at the time t3, a negative high voltage of −VCCH is given as the voltage Vpgm. However, the P-channel MOS transistor 104 is in a non-conducted state because the voltage difference Vgs between the gate and the source of the P-channel MOS transistor 104 is 0V. Therefore, by capacitive coupling, the node N11 shifts while having approximately the same voltage as the voltage Vpgm, so that the antifuse 102 is not blown.

Figure 16:
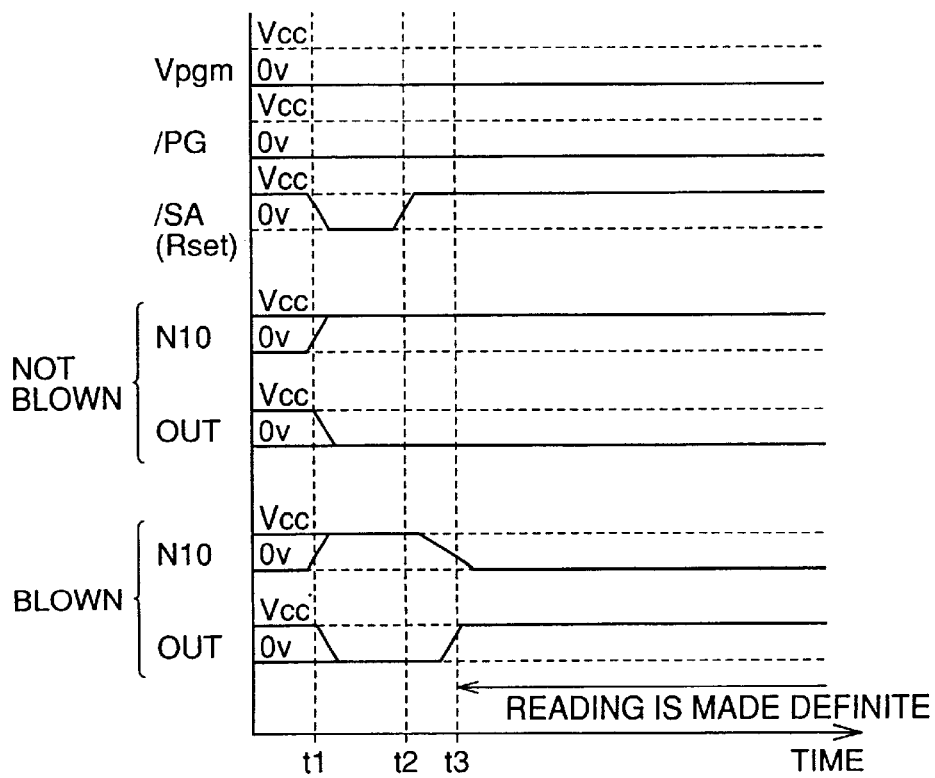
FIG. 16 is an operation waveform diagram for describing a reading operation.

FIG. 16 is an operation waveform diagram for describing a reading operation.

Referring to FIGS. 13 and 16, in an initial state, 0V is given as the voltage Vpgm, and the L-level is given as a signal /PG2.

During the time t1 to t2, the signal /SA is set at the L-level. This maintains the input node N10 of the latch circuit 110 to be in an H-state.

In the case where the antifuse 102 has not been blown and not short-circuited, this state does not change. On the other hand, in the case where the antifuse 102 has been blown, the voltage of the node N10 tends to change to the L-level because the voltage Vpgm is 0V.

When the voltage of the node N10 which is the input of the inverter 116 exceeds a logical threshold voltage, the maintained value of the latch circuit 110 is inverted and thereafter the voltage of the node N10 is maintained at the H-level. By differentiating the state of the output signal OUT, the address judgement of a redundancy judgement circuit in a semiconductor memory device, a tuning operation in an analog circuit, or the like can be carried out.

As described above, in the seventh embodiment also, the electric current flowing through the antifuse can be cut off after the antifuse is blown, so that the voltage Vpgm is prevented from falling and the reliability of the fuse blowing operation can be enhanced.

Eighth Embodiment

In the seventh embodiment, the voltage difference Vgd between the gate and the drain of the P-channel MOS transistor 104 of FIG. 13 increases at the time of the blowing operation of the antifuse.

For example, in FIG. 14, when the antifuse 102 is blown at the time t4, the voltage of the node N11 falls down to −VCCH. At this time, the voltage difference of −VCCH is applied between the node N11 and the gate of the P-channel MOS transistor 104. If the blowing voltage of −VCCH is increased, the voltage difference Vgd between the gate and the drain of the P-channel MOS transistor 104 increases all the more.

Figure 17:
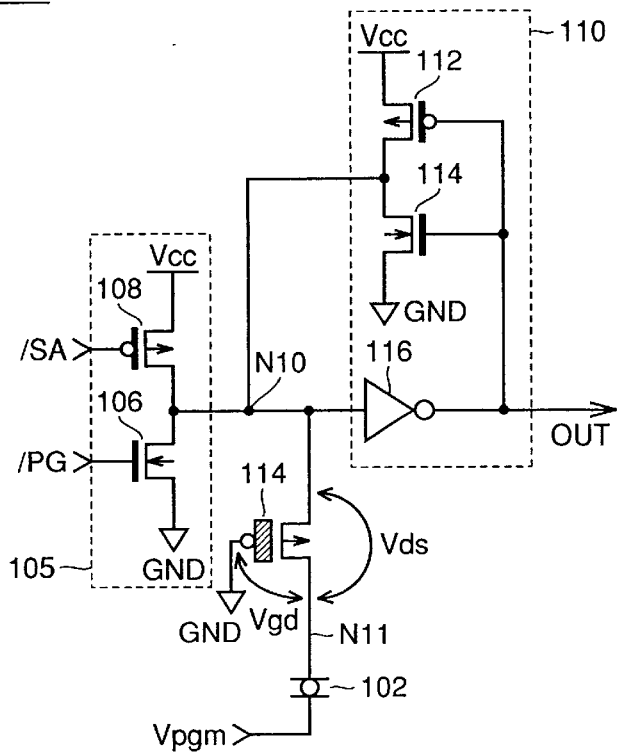
FIG. 17 is a circuit diagram illustrating a construction of an antifuse program circuit 110.0 used in an eighth embodiment.

FIG. 17 is a circuit diagram illustrating a construction of an antifuse program circuit 110.0 used in the eighth embodiment of the present invention.

Referring to FIG. 17, the antifuse program circuit 110.0 includes a P-channel MOS transistor 114 instead of the P-channel MOS transistor 104 in the construction of the antifuse program circuit 100.0 shown in FIG. 13. The P-channel MOS transistor 114 is a transistor having a larger gate dielectric strength than the P-channel MOS transistor 114 in FIG. 13. For example, as a method for increasing the gate dielectric strength, there is a method of increasing the film thickness Tox of the gate oxide film.

Further, in FIG. 15, at the time t3, a voltage of a similar degree is applied to the P-channel MOS transistor 104 at the time t3. In this case also, the destruction can be prevented by changing to the P-channel MOS transistor 114. By adopting the aforesaid construction, the voltage of −VCCH which is the blowing voltage of the fuse can be increased, so that the destruction of the insulator film of the antifuse can be carried out easily and with certainty.

Ninth Embodiment

In the ninth embodiment, a gate for controlling the resistance at the time of blowing the antifuse is added to the antifuse program circuit described in the seventh embodiment.

Figure 18:
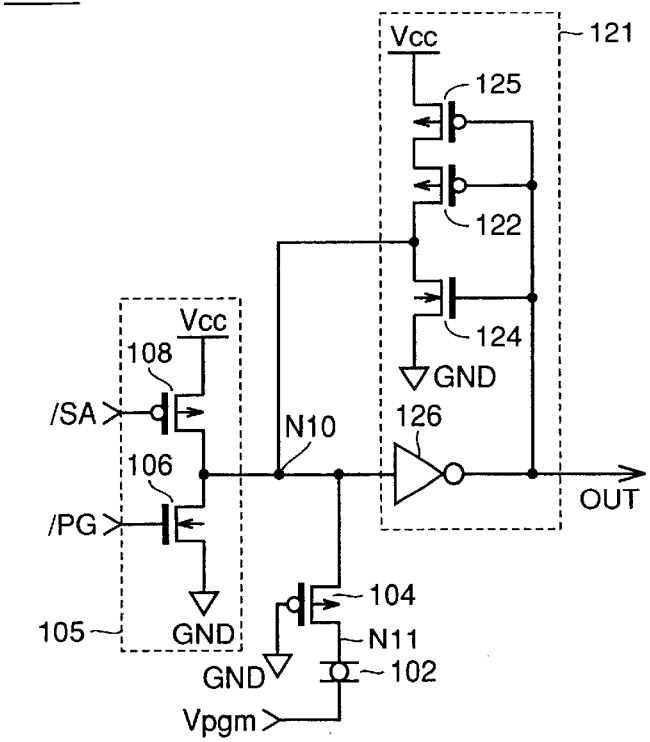
FIG. 18 is a circuit diagram illustrating a construction of an antifuse program circuit 120.0 used in a ninth embodiment.

FIG. 18 is a circuit diagram illustrating a construction of an antifuse program circuit 120.0 used in the ninth embodiment of the present invention.

Referring to FIG. 18, the antifuse program circuit 120.0 includes a latch circuit 121 instead of the latch circuit 110 in the construction of the antifuse program circuit 100.0 shown in FIG. 13.

The latch circuit 121 includes an inverter 126 whose input is connected to the node N10 and which outputs an output signal OUT, P-channel MOS transistors 125, 122 whose gates both receive the output signal OUT and which are connected in series between the node to which the power source voltage Vcc is given and the node N10, and an N-channel MOS transistor 124 which is connected between the node N10 and the ground node and whose gate receives the output signal OUT.

Except for the aforesaid difference, the construction of the antifuse program circuit 120.0 is the same as that of the antifuse program circuit 100.0, so that the description thereof will not be repeated.

In other words, by further connecting a P-channel MOS transistor 125 in series with the P-channel MOS transistor 122 which is activated by the output signal OUT when the node N10 is at the H-level, the resistance value of the path that connects the node N10 to the power source voltage Vcc is increased.

This facilitates inversion of the data maintained in the latch circuit 121 even in the case where the resistance value of the antifuse 102 after blowing is large. In the case where the resistance value of the antifuse after blowing is set to be large, a state is generated in which the electric current flows from the ground node to the node to which the blowing voltage of −VCCH is given, unless the latch circuit 121 is not inverted.

By adopting a construction shown in FIG. 18, by addition of the P-channel MOS transistor 125 for adjustment of the resistance value, the maintained value of the latch circuit can be inverted with certainty after the antifuse is blown, so that the electric current can be prevented from flowing after the antifuse is blown.

Tenth Embodiment

Figure 19:
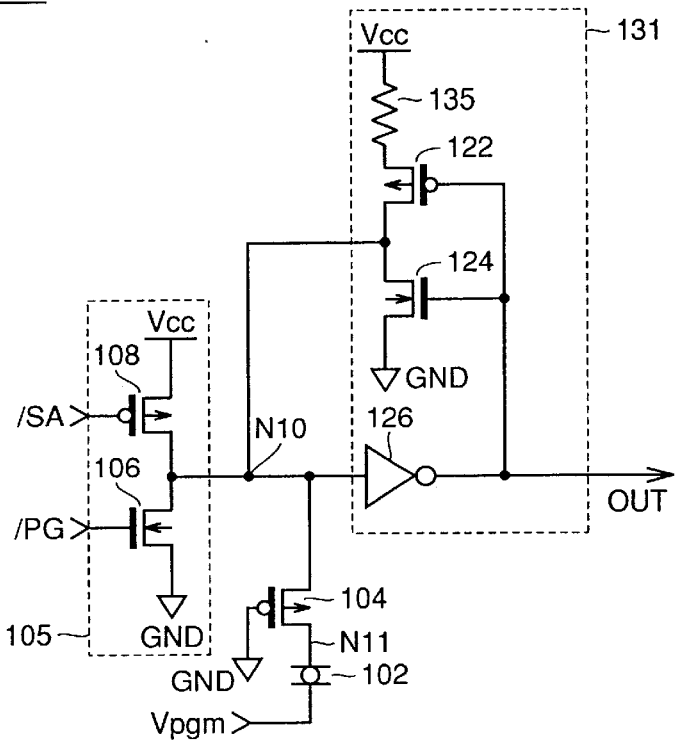
FIG. 19 is a circuit diagram illustrating a construction of an antifuse program circuit 130.0 used in a tenth embodiment.

FIG. 19 is a circuit diagram illustrating a construction of an antifuse program circuit 130.0 used in the tenth embodiment of the present invention.

Referring to FIG. 19, the antifuse program circuit 130.0 includes a latch circuit 131 instead of the latch circuit 121 in the construction of the antifuse program circuit 120.0 shown in FIG. 18.

The latch circuit 131 includes a resistor element 135 instead of the P-channel MOS transistor 125 in the construction of the latch circuit 121 in FIG. 18. Except for the aforesaid difference, the construction of the antifuse program circuit 130.0 is the same as that of the antifuse program circuit 120.0 shown in FIG. 18, so that the description thereof will not be repeated.

As described above, by inserting a resistor in place of the P-channel MOS transistor, the latch can be inverted after the blowing operation even if the resistance value of the fuse after blowing is large. Also, by inverting the latch, the electric current can be prevented from flowing after the antifuse is blown.

Therefore, by inserting a resistor, the latch inversion is facilitated even if the resistance value of the antifuse after blowing is set to be large, and the electric current can be prevented from flowing through the antifuse after the fuse-blowing, thereby preventing fluctuations in the voltage Vpgm.

Eleventh Embodiment

Figure 20:
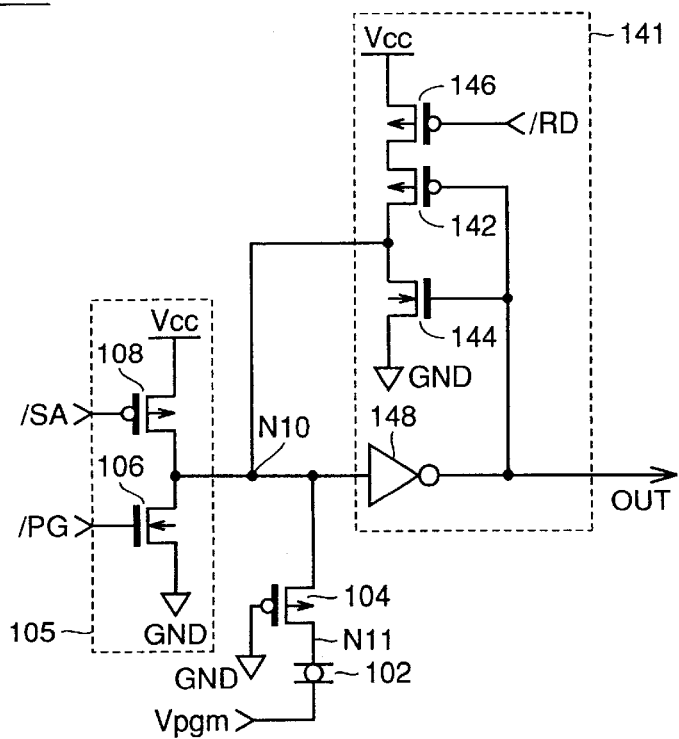
FIG. 20 is a circuit diagram illustrating a construction of an antifuse program circuit 140.0 used in an eleventh embodiment.

FIG. 20 is a circuit diagram illustrating a construction of an antifuse program circuit 140.0 used in the eleventh embodiment of the present invention.

Referring to FIG. 20, the antifuse program circuit 140.0 includes a latch circuit 141 instead of the latch circuit 110 in the construction of the antifuse program circuit 100.0 shown in FIG. 13.

The latch circuit 141 includes an inverter 148 whose input is connected to the node N10 and which outputs an output signal OUT, P-channel MOS transistors 146, 142 which are connected in series between the node to which the power source voltage Vcc is given and the node N10, and an N-channel MOS transistor 144 which is connected between the node N10 and the ground node.

The gate of the P-channel MOS transistor 146 receives a signal /RT. The gates of the P-channel MOS transistor 142 and the N-channel MOS transistor 144 both receive the output signal OUT.

An operation will be briefly described. First, the node N10 is set at the H-level by activating the signal /SA to allow the P-channel MOS transistor 108 to be in a conducted state.

Subsequently, the signal /RT is set at the H-level to bring the node N10 into a floating state. If the fuse has been blown, the voltage of the node N10 changes from the H-level to the L-level. When the voltage of the node N10 crosses the logical threshold voltage of the inverter 148, the output signal OUT changes from the L-level to the H-level, whereby the N-channel MOS transistor 144 is brought to the conducted state to latch the node N10 at the L-level.

On the other hand, if the antifuse 102 has not been blown, the floating state of the node N10 is maintained. In the floating state, the node N10 is at the H-level. Thereafter, by setting the signal /RD to be the L-level, the level of the node in this floating state is latched by the latch circuit 141.

As described above, in reading out whether the antifuse 102 has been blown or not, the reading operation is carried out while the node N10 is in the floating state by inactivating a part of the latch circuit 141. Therefore, even in the case where the resistance value after blowing of the antifuse 102 is large or in the case where the resistance value increases with lapse of time, the state of the antifuse can be accurately read out.

Twelfth Embodiment

Figure 21:
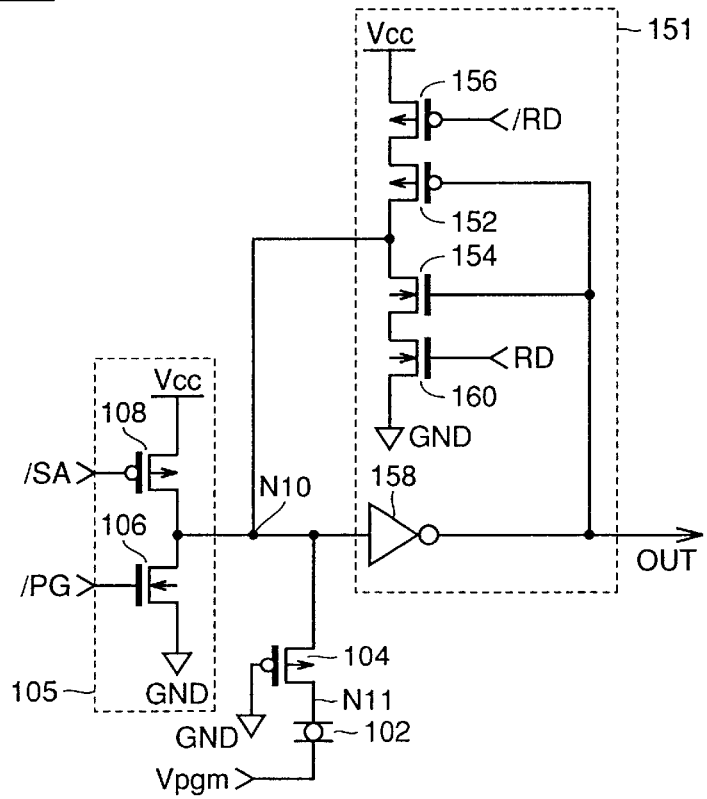
FIG. 21 is a circuit diagram illustrating a construction of an antifuse program circuit 150.0 used in a twelfth embodiment.

FIG. 21 is a circuit diagram illustrating a construction of an antifuse program circuit 150.0 used in the twelfth embodiment of the present invention.

Referring to FIG. 21, the antifuse program circuit 150.0 includes a latch circuit 151 instead of the latch circuit 110 in the construction of the antifuse program circuit 100.0 shown in FIG. 13.

The latch circuit 151 includes an inverter 158 whose input is connected to the node N10 and which outputs an output signal OUT, P-channel MOS transistors 156, 152 which are connected in series between the node to which the power source voltage Vcc is given and the node N10, and N-channel MOS transistors 154, 160 which are connected in series between the node N10 and the ground node.

The gates of the P-channel MOS transistor 152 and the N-channel MOS transistor 154 both receive the output signal OUT. The gate of the P-channel MOS transistor 156 receives the signal /RD, and the gate of the N-channel MOS transistor 160 receives the signal RD.

By adopting such a construction, in the reading operation, the feed-back part of the latch circuit 151 is completely inactivated in accordance with the signal RD; the signal RD is activated after the node N10 is made definite in accordance with the state of the fuse; and the state is latched by the latch circuit 151. Therefore, the reliability of the reading operation is improved in the same manner as in the eleventh embodiment.

A reading operation will be described. First, the signal SA is set at the L-level to set the node N10 at the H-level. At the same time, the signal RD is set at the L-level to bring the transistors 156, 160 into a non-conducted state. This allows the node N10 to be in a floating state.

In accordance therewith, if the antifuse 102 has been blown, the voltage of the node N10 is brought to the L-level, whereas if the antifuse 102 has not been blown, the voltage of the node N10 is maintained at the H-level.

When either one of these two states is made definite, the signal RD is thereafter activated to the H-level to activate the latch circuit 151, whereby the reading operation is completed. The output signal OUT of the latch circuit 151 is used as a signal for redundancy judgement or for tuning of an analog circuit or the like.

As described above, even in the case where the resistance value after blowing of the antifuse 102 is large or in the case where the resistance value of the antifuse increases with lapse of time, the state of the antifuse 102 can be accurately read out by allowing the node N10 to be in a floating state at the reading time.

Thirteenth Embodiment

In the thirteenth embodiment, the output signal OUT of the antifuse program circuits described in the first to twelfth embodiments is output to the outside and given to a tester device.

Figure 22:
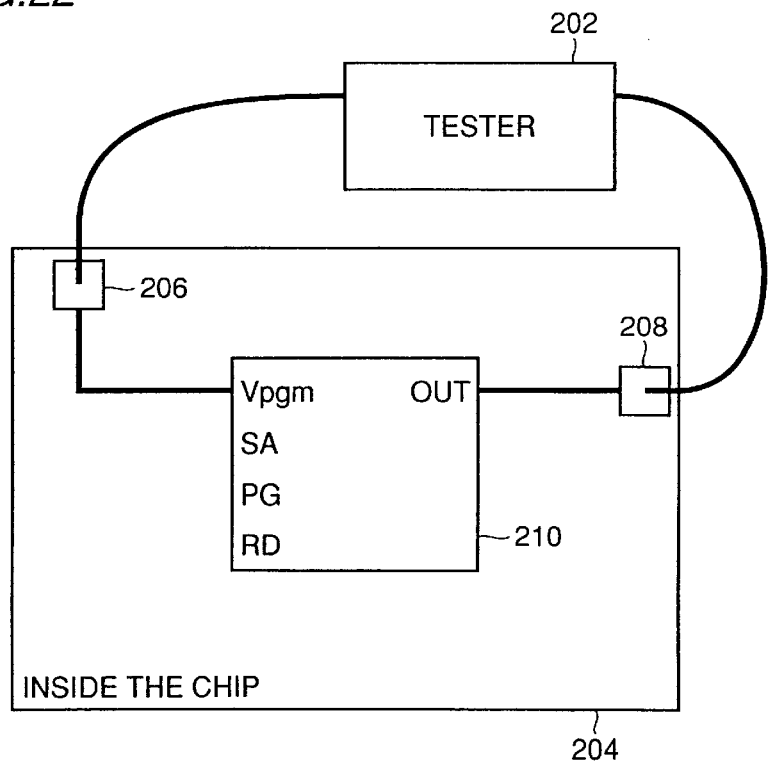
FIG. 22 is a schematic view for describing a state of connection between a tester and a semiconductor device in a thirteenth embodiment.

FIG. 22 is a schematic view for describing a connection state of a tester and a semiconductor device in the thirteenth embodiment of the present invention.

Referring to FIG. 22, the semiconductor device 204 includes a pad 206 for giving a voltage Vpgm from outside to an antifuse program circuit 210, and a pad 208 for outputting an output signal OUT to the outside. The tester 202 gives the voltage Vpgm to the pad 206.

At the time of a blowing operation, a high voltage is applied from the tester 202 as the voltage Vpgm. At this time, if the antifuse is blown, the output signal OUT changes from the H-level to the L-level or changes from the L-level to the H-level. This logical change is observed by the tester 202 and, when the change in the output signal OUT is observed, supply of the high voltage as the voltage Vpgm is thereafter stopped.

In the case where the antifuse program circuit 210 is not selected and the antifuse contained in the inside need not be blown, the value of the output signal OUT is, for example in the circuit of FIG. 3, at the L-level corresponding to the case where the antifuse is not blown from the beginning. In this case, the high voltage need not be applied, so that the tester can avoid application of the high voltage by observing the output signal OUT.

As described above, by outputting the output signal OUT to the outside, application of the high voltage can be stopped as soon as the antifuse is blown. Also, by observing the signal OUT in real time, the blow state of the fuse can be found out.

Therefore, reduction in the program time of the antifuse and others can be achieved.

Fourteenth Embodiment

Figure 23:
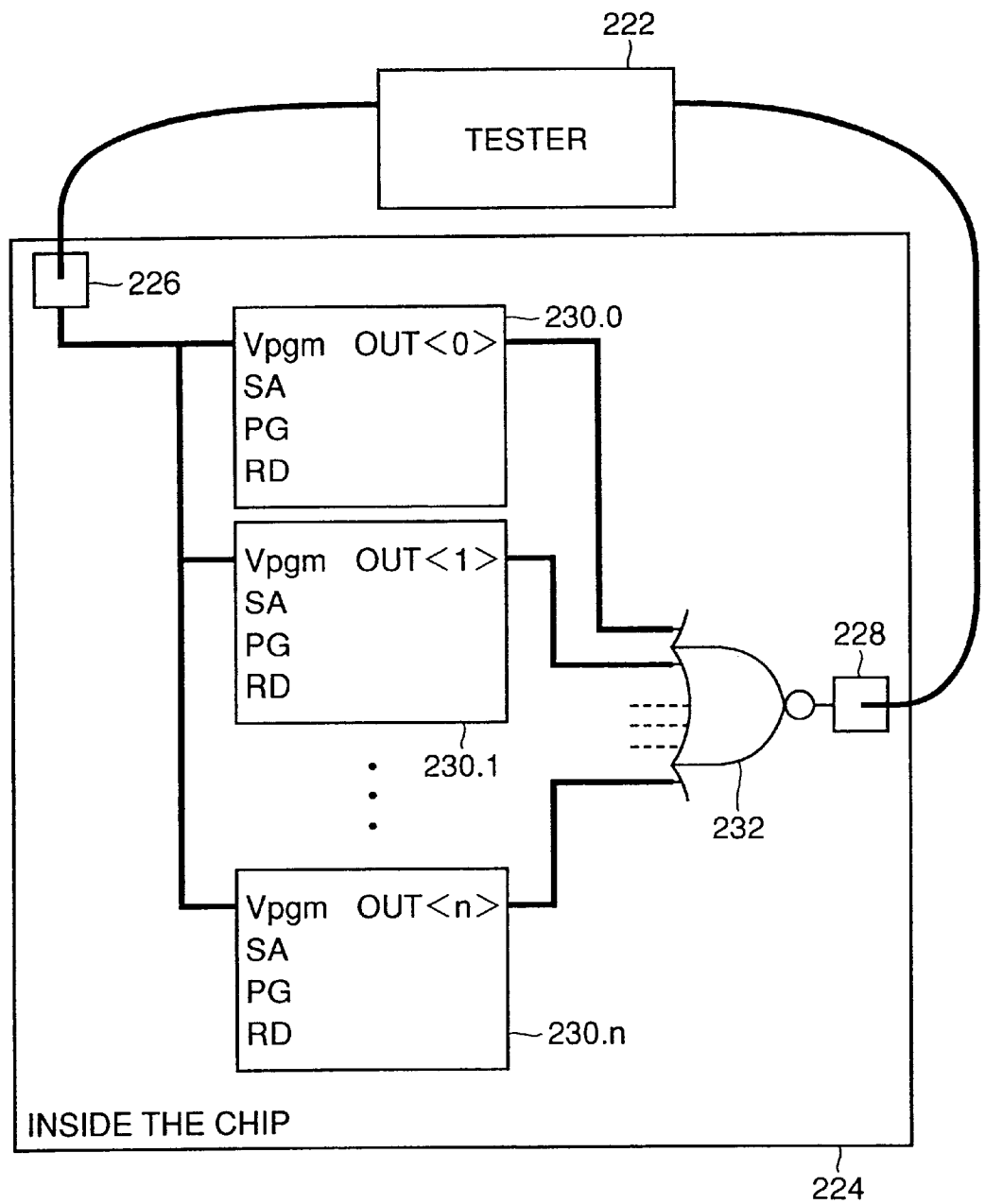
FIG. 23 is a view illustrating a construction in which antifuses inside a plurality of antifuse program circuits are blown at the same time.

FIG. 23 is a view illustrating a construction in which the antifuses in the inside of a plurality of antifuse program circuits are simultaneously blown.

Referring to FIG. 23, the semiconductor device 224 includes a pad 226 for giving a voltage Vpgm from the outside, antifuse program circuits 230.0 to 230.n that receive the voltage Vpgm from the pad 226, a gate circuit 232 that receives output signals OUT<0> to OUT<n> output from the antifuse program circuits 230.0 to 230.n, and a pad 228 for outputting the output of the gate circuit 232 to the outside.

The tester 222 sets the voltage Vpgm at a high voltage at the fuse-blowing time, and observes the voltage of the pad 228.

In the case of the antifuse program circuits described in the first to sixth embodiments, the signal OUT changes from the H-level to the L-level when the antifuse is blown. In such a case, completion of blowing of all the fuses in the antifuse program circuits selected for blowing is output from the pad 228 by generating signals /OUT, which are obtained by inversion of the signals OUT, in the chip and taking their NOR.

In the case of the antifuse program circuits described in the seventh to twelfth embodiments, the signal OUT changes from the L-level to the H-level when the antifuse is blown. Therefore, it is sufficient that the gate circuit 232 takes the NOR of the output signals OUT as they are, for output from the pad 228.

Thus, by outputting the output signal of the gate circuit 232 via the pad 228 to the tester on the outside and observing the change of the voltage from the L-level to the H-level, completion of the blowing of all the fuses in the antifuse program circuits can be judged from the outside.

Fifteenth Embodiment

In the prior art, as described in the aforementioned document 2000 IEEE International Solid-State Circuits Conference "WP 24.8 Antifuse FPROM Circuit for Field Programmable DRAM", a capacitor having a thin insulator film disposed between the two polysilicon electrodes is used as an antifuse element, and the fuse is blown by application of a voltage between the electrodes of the capacitor.

Figure 24:
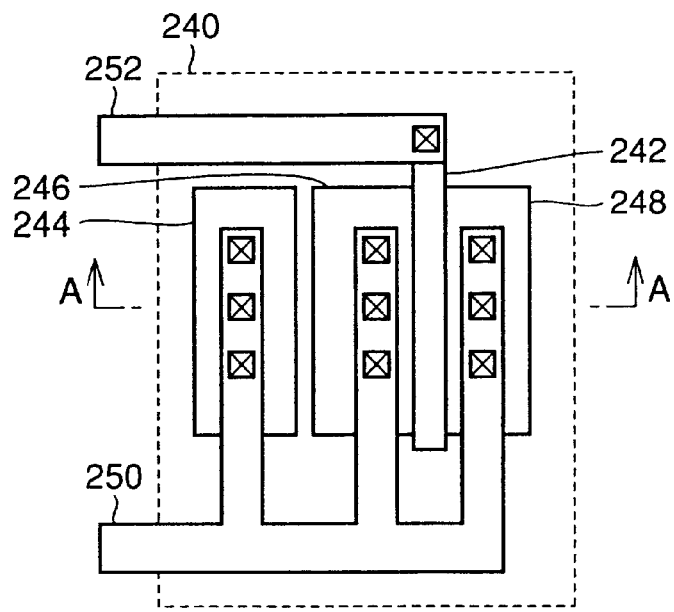
FIG. 24 is a plan view for describing a structure of a fuse element used in a fifteenth embodiment.

FIG. 24 is a plan view for describing a structure of a fuse element used in the fifteenth embodiment of the present invention.

Referring to FIG. 24, an N-type impurity region 244 and P-type impurity regions 246, 248 are disposed in an N-well 240, and a gate electrode 242 is disposed between the P-type impurity region 246 and the P-type impurity region 248. A signal is given to the gate electrode 242 by a metal wiring 252. A predetermined voltage is given to the impurity regions 244, 246, 248 by a metal wiling 250.

Figure 25:
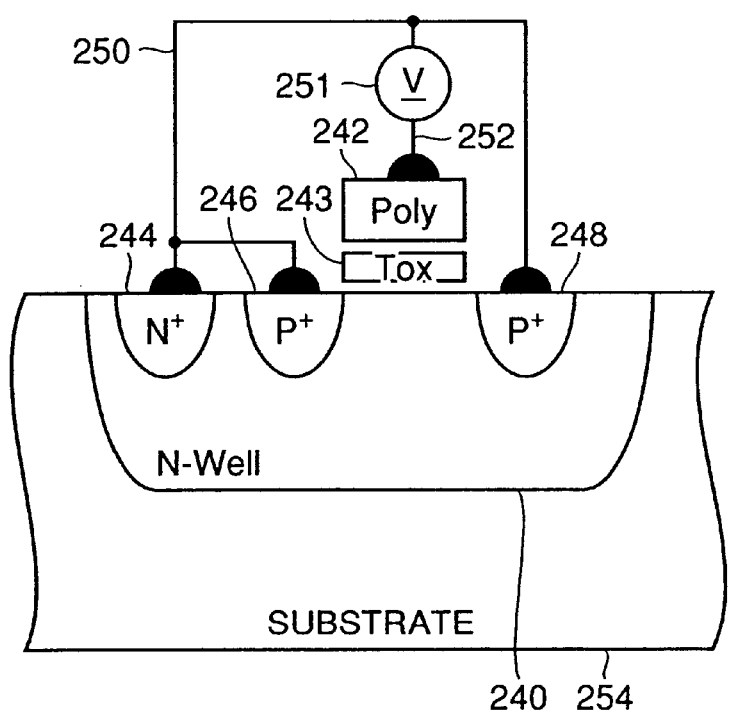
FIG. 25 is a cross-sectional view along the line A—A of FIG. 24.

FIG. 25 is a cross-sectional view along the line A—A of FIG. 24.

Referring to FIG. 25, an N-well 240 is disposed in the principal surface of a substrate 254, and an N-type impurity region 244 and P-type impurity regions 246, 248 are disposed in the inside of the N-well. A gate oxide film 243 is disposed above the region between the P-type impurity regions 246, 248, and a gate electrode 242 formed of polysilicon is disposed above the gate oxide film 243. The impurity regions 246, 248 are a source and a drain of a P-channel MOS transistor. The gate electrode 242 is a gate electrode of the P-channel MOS transistor.

By allowing the gate electrode of such a MOS transistor to be one electrode of an antifuse and connecting the P-type impurity regions 246, 248 and the N-type impurity region 244 as the other end of the antifuse, a high electric field can be applied between the N-well 240 and the gate electrode 242, and at the same time, a high electric field can be applied at an edge part between the gate electrode and the source and drain. By giving a voltage difference at these two parts, the antifuse can be easily destroyed.

Figure 26:
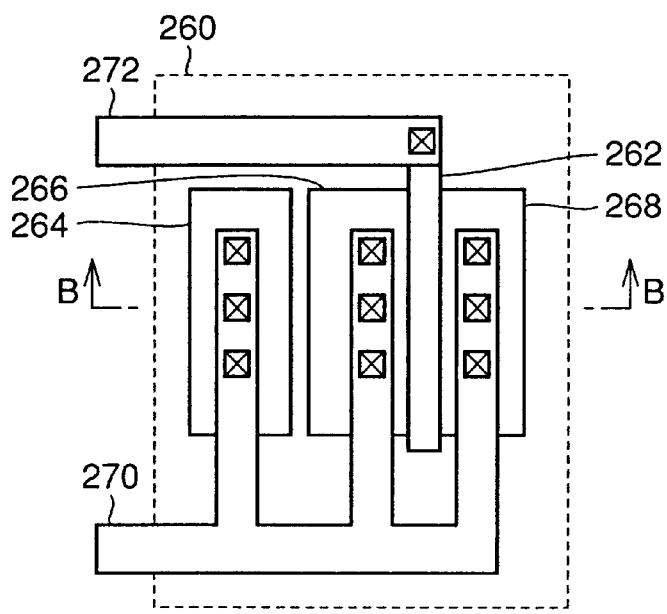
FIG. 26 is a plan view illustrating a modification in which an N-channel MOS transistor is used as an antifuse.

FIG. 26 is a plan view illustrating a modification in which an N-channel MOS transistor is used as an antifuse.

Referring to FIG. 26, a P-type impurity region 264 and N-type impurity regions 266, 268 are disposed in a P-well 260, and a gate electrode 262 is disposed between the N-type impurity region 266 and the N-type impurity region 268. A signal is given to the gate electrode 262 by a metal wiring 272. A predetermined voltage is given to the impurity regions 264, 266, 268 by a metal wiring 270.

Figure 27:
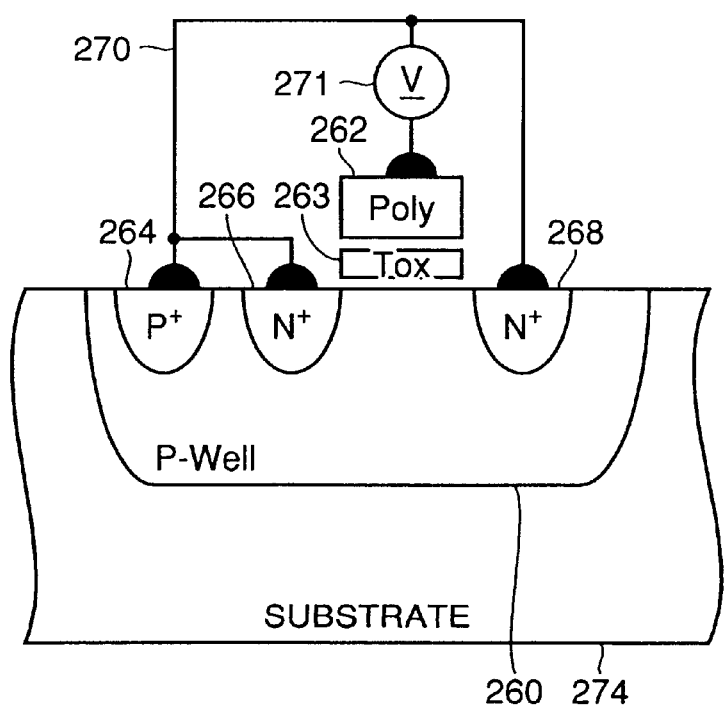
FIG. 27 is a cross-sectional view along the line B—B of FIG. 26.

FIG. 27 is a cross-sectional view along the line B—B of FIG. 26.

Referring to FIG. 27, a P-well 260 is disposed in the principal surface of a substrate 274, and a P-type impurity region 264 and N-type impurity regions 266, 268 are disposed in the inside of the P-well. A gate oxide film 263 is disposed above the region between the N-type impurity regions 266, 268, and a gate electrode 262 formed of polysilicon is disposed above the gate oxide film 263. The impurity regions 266, 268 are a source and a drain of an N-channel MOS transistor. The gate electrode 262 is a gate electrode of the N-channel MOS transistor.

By allowing the gate electrode of such a MOS transistor to be one electrode of an antifuse and connecting the N-type impurity regions 266, 268 and the P-type impurity region 264 as the other end of the antifuse, a high electric field can be applied between the P-well 260 and the gate electrode 262, and at the same time, a high electric field can be applied at an edge part between the gate electrode and the source and drain. By generating a voltage difference at these two parts for dielectric breakdown, the antifuse can be easily destroyed.

As described above, by using a MOS transistor as an antifuse element as in the fifteenth embodiment, the antifuse can be blown more easily.

Sixteenth Embodiment

In the sixteenth embodiment, application of a voltage to an antifuse element that uses a MOS transistor will be described.

Figure 28:
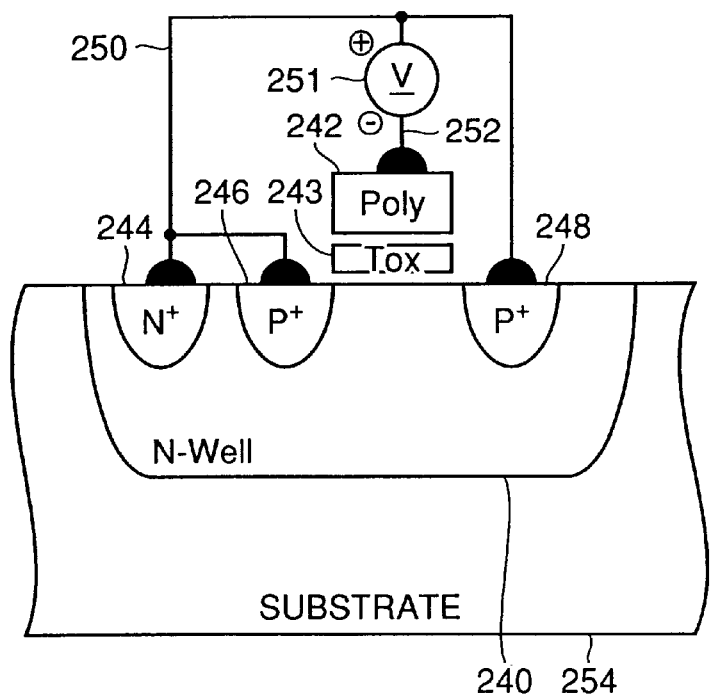
FIG. 28 is a cross-sectional view for describing application of a voltage to an antifuse that uses a P-channel MOS transistor.

FIG. 28 is a cross-sectional view for describing application of a voltage to an antifuse that uses a P-channel MOS transistor.

Figure 29:
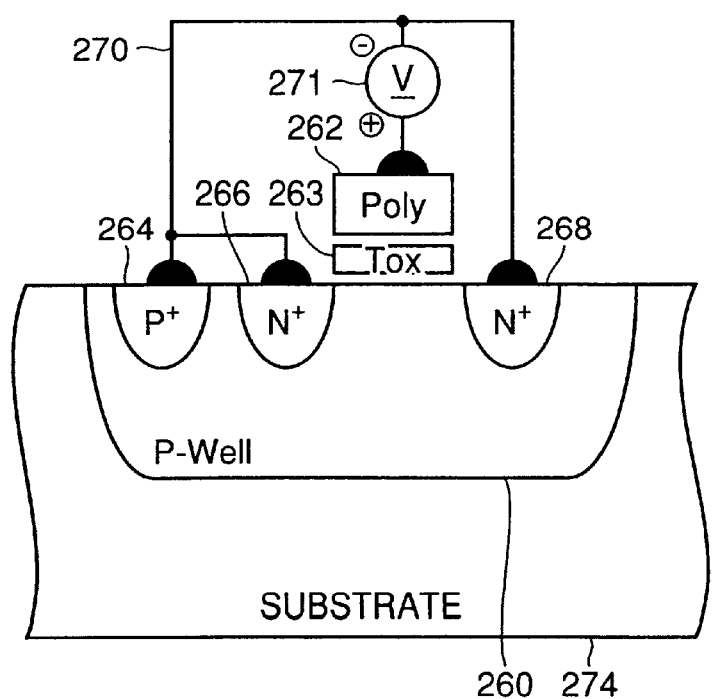
FIG. 29 is a view for describing application of a voltage in the case where an N-channel MOS transistor is used as an antifuse.

FIG. 29 is a cross-sectional view for describing application of a voltage to an antifuse that uses an N-channel MOS transistor.

Referring to FIGS. 28 and 29, since the gate oxide film of the MOS transistor is thin, the gate oxide film is destroyed when a voltage difference is generated between the gate and the source, between the gate and the drain, or between the gate and the substrate. However, the breakdown voltage of the gate oxide film may vary depending on a method of applying a voltage.

In order to destroy the gate oxide film with a small voltage difference, a voltage is applied to the gate oxide film without generating a depletion layer in the MOS transistor. In other words, the gate oxide film is destroyed by giving a voltage difference between the fuse electrodes while the MOS transistor is in an ON-state.

As shown in FIG. 28, in the case of a P-channel MOS transistor, a voltage lower than the voltage of the source, drain, and substrate is applied to the gate to destroy the gate oxide film. For this purpose, a voltage generating circuit 251 that generates such a voltage difference between the source, drain, substrate and the gate is disposed in a chip. Alternatively, for example, wiring 250, 252 are disposed for transmitting such a voltage from the outside.

On the other hand, in the case of an N-channel MOS transistor, a voltage higher than the source, drain, and substrate voltage is applied to the gate voltage to destroy the gate oxide film, as shown in FIG. 29.

As described above, in the case of using a MOS transistor as an antifuse, the antifuse can be blown with a small voltage difference by applying a voltage such that the MOS transistor will be in an ON-state, for blowing.

Seventeenth Embodiment

In the sixteenth embodiment, the gate oxide film is destroyed by applying a voltage that does not generate a depletion layer in the case where a structure of a MOS transistor is used as an antifuse. In the seventeenth embodiment, a structure for destroying a gate oxide film will be described in which the structure of an antifuse element is further devised to make an element where a depletion layer is not likely to be generated.

Figure 30:
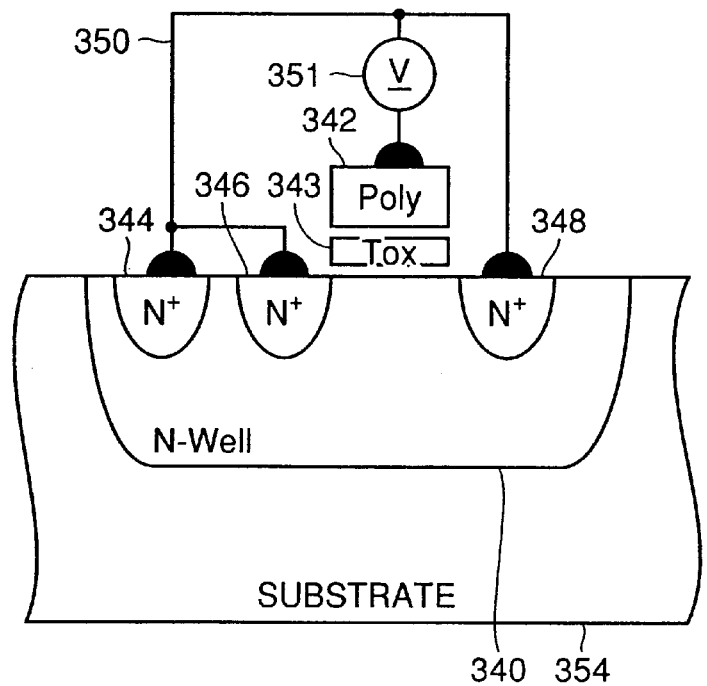
FIG. 30 is a cross-sectional view illustrating a structure of an antifuse element used in a seventeenth embodiment.

FIG. 30 is a cross-sectional view illustrating a structure of an antifuse element used in the seventeenth embodiment of the present invention.

Referring to FIG. 30, an N-well 340 is disposed in the principal surface of a substrate 354, and N-type impurity regions 344, 346, 348 are disposed in the inside of the N-well 340. An oxide film 343 is disposed above the N-well in the region between the N-type impurity regions 346, 348. An electrode 342 formed of polysilicon is disposed above the oxide film 343. Further, a wiring 350 is disposed for connecting the N-type impurity regions 344, 346, and 348. A high voltage for causing dielectric breakdown of the oxide film 343 is applied between the wiring 350 and the electrode 342.

A depletion layer is prevented from being generated by using a structure in which the conductivity type of the impurity regions present on both sides of the region under the gate electrode in the structure of the P-channel MOS transistor is changed from the P-type to the N-type, in the inside of the N-well 340. The gate oxide film 343 can be easily destroyed by applying a high electric field between the electrode 342 and the wiring that connects the N-channel MOS transistors 344, 346, 348.

Further, such a structure, i.e. implantation of an N-type impurity into a surface part of the N-type impurity regions 346, 348, can be easily implemented by only partially changing a photomask used in an implantation step in a general process for producing a MOS transistor.

Figure 31:
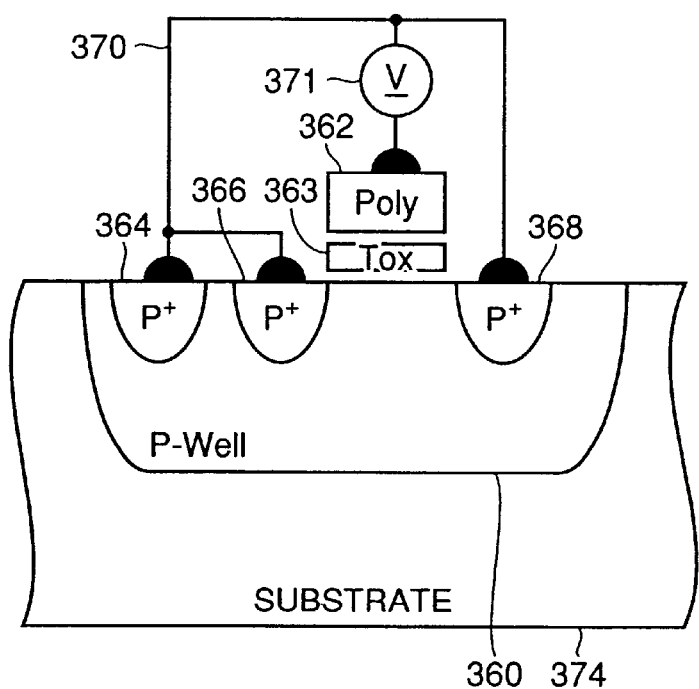
FIG. 31 is a cross-sectional view illustrating another example of an antifuse element.
Figure 32:
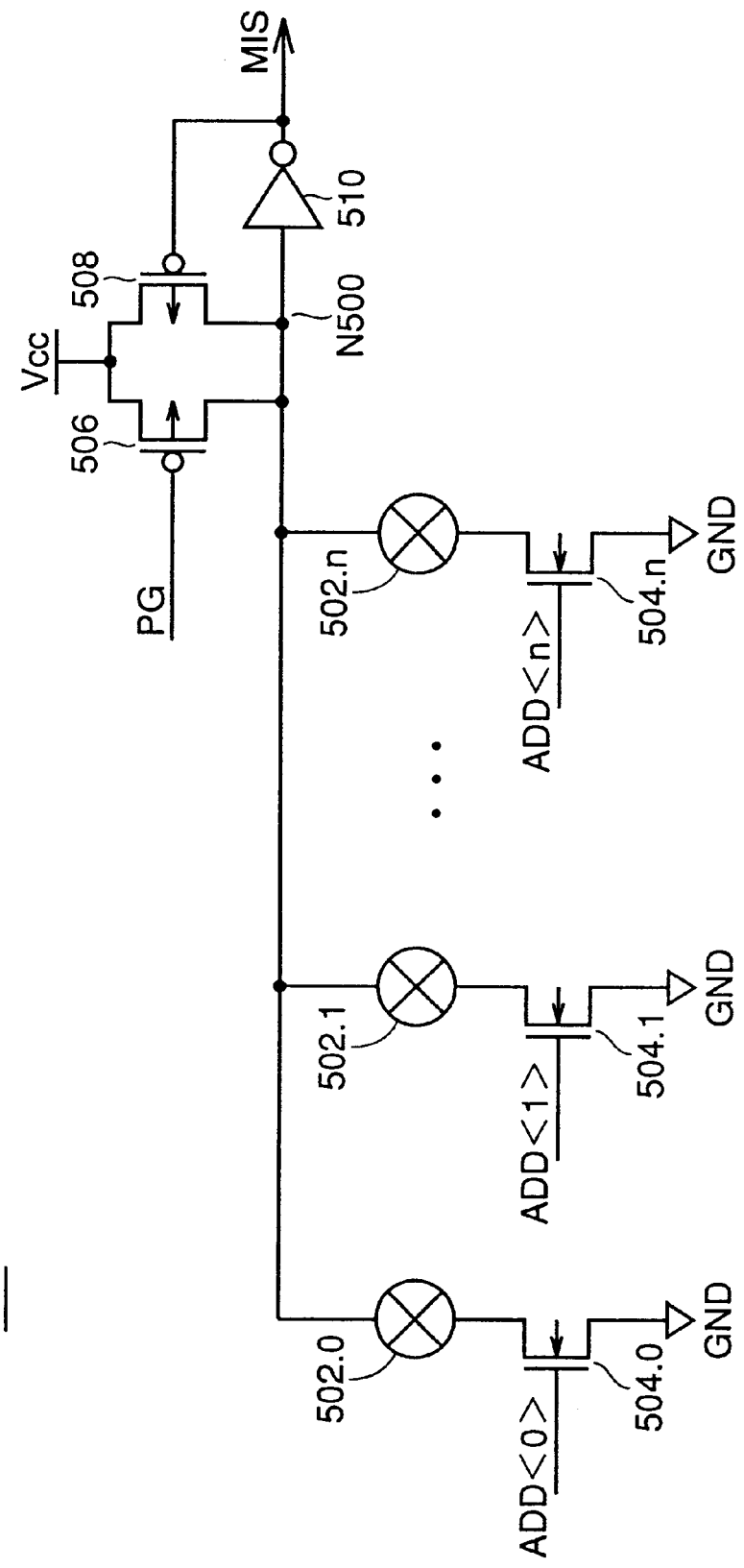
FIG. 32 is a circuit diagram illustrating a construction of a conventional address sensing circuit 500.
Figure 33:
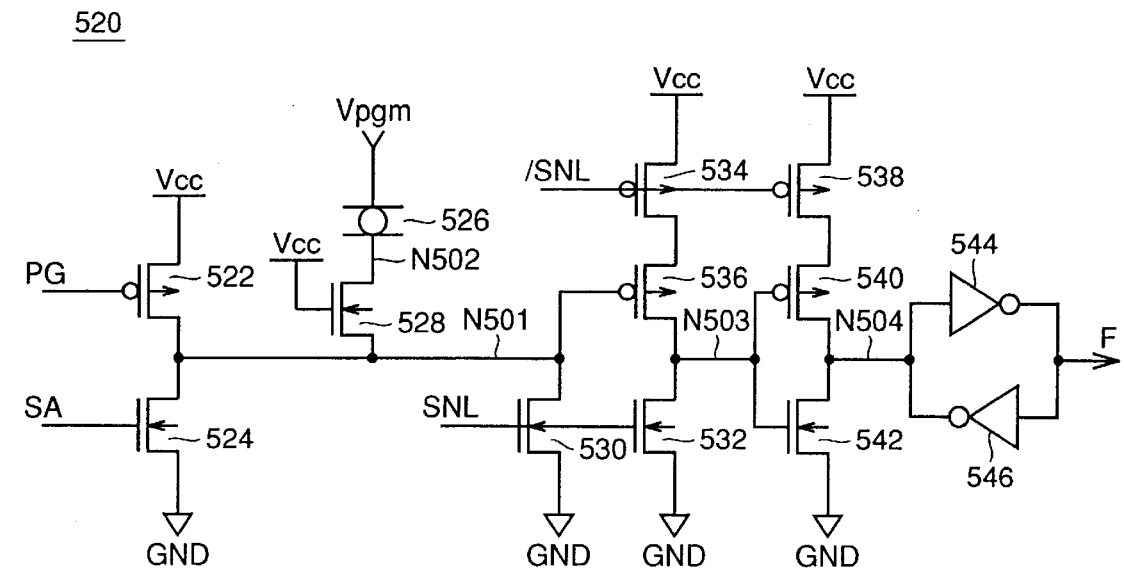
FIG. 33 is a circuit diagram illustrating a construction of an antifuse program circuit 520.
Figure 34:
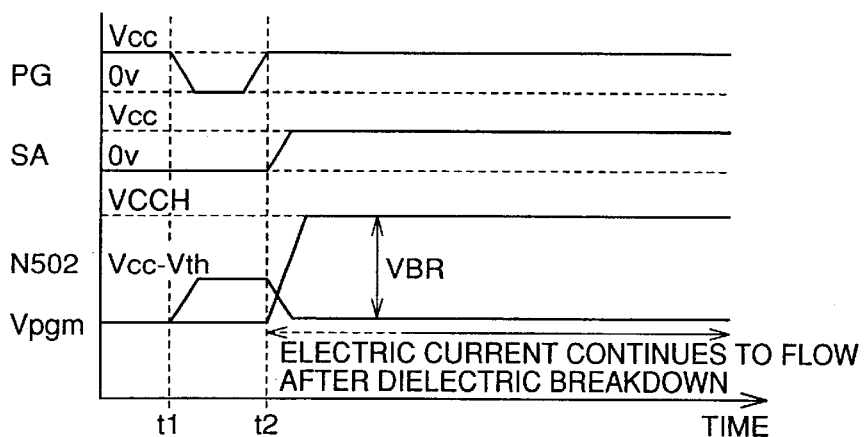
FIG. 34 is an operation waveform diagram for describing a fuse blowing operation of the antifuse program circuit 520 shown in FIG. 33.
Figure 35:
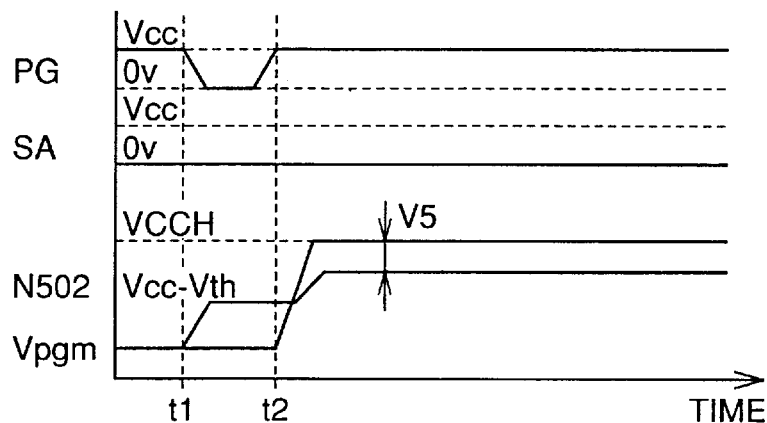
FIG. 35 is an operation waveform diagram for describing an operation in the case where the fuse-blowing is not carried out.
Figure 36:
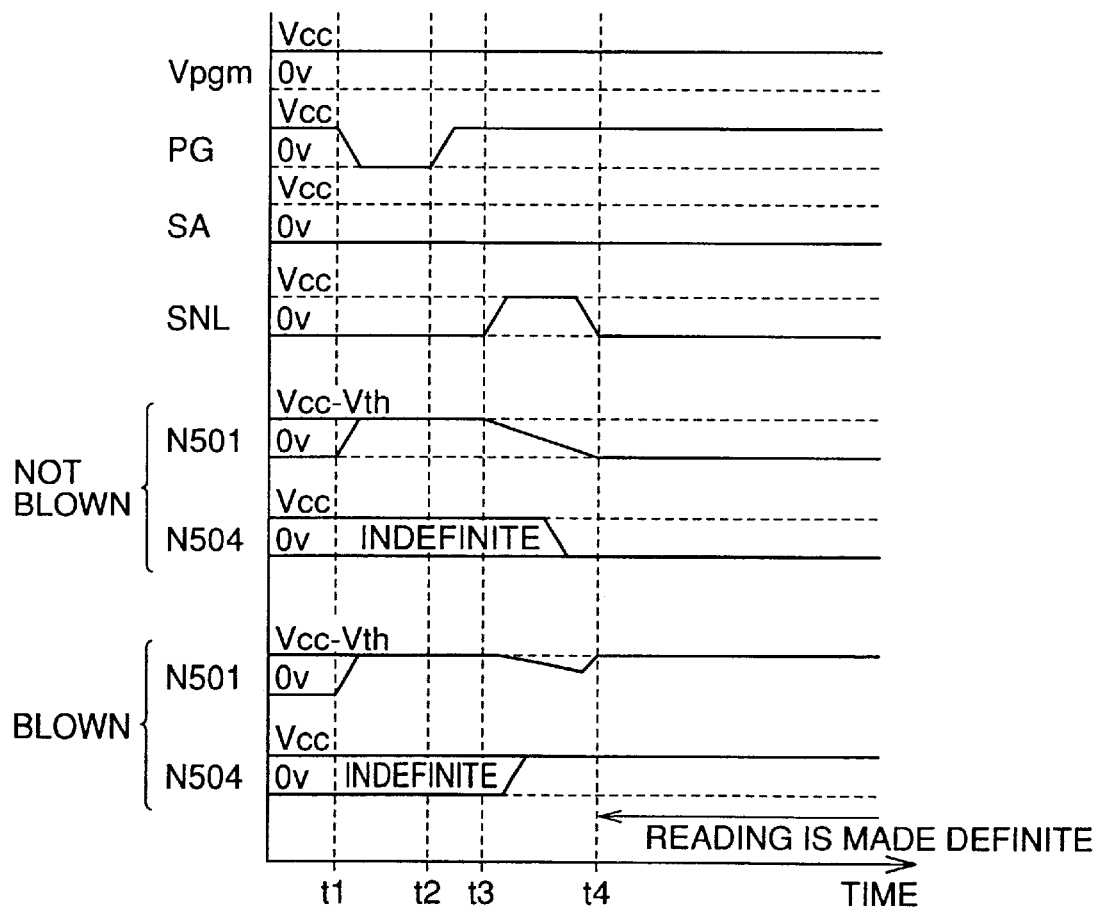
FIG. 36 is an operation waveform diagram for describing a reading operation of the antifuse program circuit 520.

FIG. 31 is a cross-sectional view illustrating another example of an antifuse element.

Referring to FIG. 31, a P-well 360 is disposed in the principal surface of a substrate 374, and P-type impurity regions 364, 366, 368 are disposed in the inside of the P-well 360. In such a case also, effects similar to those provided by the structure shown in FIG. 30 can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    an antifuse having one end and other end connected respectively to a first node and a second node, where an electrically conductive path is formed between said one end and said other end by application of a voltage exceeding a predetermined value between said one end and said other end;
    an electric current limiting circuit that limits an electric current flowing between said second node and a third node in accordance with a voltage of said third node;
    a latch circuit for maintaining the voltage of said third node; and
    an initializing circuit providing an initial voltage to the voltage of said third node.

2. The semiconductor device according to claim 1, wherein
    said initializing circuit sets the voltage of said third node to either one voltage of a first power source voltage and a second power source voltage,
    said latch circuit maintains the set voltage of said third node after said initializing circuit is inactivated, and
    said electric current limiting circuit cuts off the electric current flowing between said second node and said third node when the voltage of said third node changes from said second power source voltage to said first power source voltage in accordance with formation of the electrically conductive path in said antifuse by application of a blowing voltage to said one end.

3. The semiconductor device according to claim 2, wherein said electric current limiting circuit includes a field effect type transistor which is connected between said second node and said third node and has a gate receiving said first power source voltage.

4. The semiconductor device according to claim 3, wherein
    said first power source voltage is a power source voltage which is higher than said second power source voltage,
    said blowing voltage is a voltage which is higher than said first power source voltage, and
    said field effect type transistor is an N-channel MOS transistor.

5. The semiconductor device according to claim 3, wherein
    said first power source voltage is a power source voltage which is lower than said second power source voltage,
    said blowing voltage is a voltage which is lower than said first power source voltage, and
    said field effect type transistor is a P-channel MOS transistor.

6. The semiconductor device according to claim 2, wherein said initializing circuit sets the voltage of said third node to said second power source voltage when said antifuse is selected for blowing, and sets the voltage of said third node to said first power source voltage when said antifuse is not selected.

7. The semiconductor device according to claim 2, wherein said initializing circuit includes:
    a first MOS transistor activated in accordance with a precharging signal and coupling said third node to said first power source voltage; and
    a second MOS transistor activated in accordance with a blowing selection signal and coupling said third node to said second power source voltage.

8. The semiconductor device according to claim 7, wherein said electric current limiting circuit includes a third MOS transistor which is connected between said second node and said third node and has a gate receiving said first power source voltage, and which has a gate oxide film thicker than gate oxide films of said first and second MOS transistors.

9. The semiconductor device according to claim 1, wherein said latch circuit includes:

a first inverter of which input is connected to said third node; and a second inverter which receives an output of said first inverter and feeds the output back to said third node.

10. The semiconductor device according to claim 9, wherein said second inverter includes a first MOS transistor of first conductivity type and a second MOS transistor of second conductivity type which are connected in series on a path that connects between a node to which the first power source voltage is given and a node to which the second power source voltage is given, and gates of said first and second MOS transistors both receive the output of said first inverter.

11. The semiconductor device according to claim 9, wherein said second inverter includes a first MOS transistor of first conductivity type and second and third MOS transistors of second conductivity type which are connected in series on a path that connects between a node to which the first power source voltage is given and a node to which the second power source voltage is given, and gates of said first to third MOS transistors all receive the output of said first inverter.

12. The semiconductor device according to claim 9, wherein said second inverter includes a first MOS transistor of first conductivity type, a second MOS transistor of second conductivity type, and a resistor element which are connected in series on a path that connects between a node to which the first power source voltage is given and a node to which the second power source voltage is given, and gates of said first and second MOS transistors both receive the output of said first inverter.

13. The semiconductor device according to claim 9, wherein said second inverter is inactivated in accordance with a reading signal that reads a state of said antifuse, and receives the output of said first inverter and feeds the output back to said third node when the voltage of said third node is determined.

14. The semiconductor device according to claim 13, wherein said second inverter includes a first MOS transistor of first conductivity type and second and third MOS transistors of second conductivity type which are connected in series on a path that connects between a node to which the first power source voltage is given and a node to which the second power source voltage is given, gates of said first and second MOS transistors both receive the output of said first inverter, and a gate of said third MOS transistor receives said reading signal.

15. The semiconductor device according to claim 1, further comprising:

a first pad for giving a blowing voltage to said one end from outside; and a second pad for observing an output of said latch circuit from outside.

16. A semiconductor device comprising:

an antifuse having one end and other end connected respectively to a first node and a second node, where an electrically conductive path is formed between said one end and said other end by application of a voltage exceeding a predetermined value between said one end and said other end;

an electric current limiting circuit that limits an electric current flowing between said second node and a third node in accordance with a voltage of said third node;

an initializing circuit providing an initial voltage to said third node; and a latch circuit having an input node connected to said third node, and maintaining the voltage of said third node when said input node is not driven.

* * * * *